(12) United States Patent
Forrest et al.

(10) Patent No.: US 7,375,370 B2
(45) Date of Patent: May 20, 2008

(54) STACKED ORGANIC PHOTOSENSITIVE DEVICES

(75) Inventors: Stephen Forrest, Princeton, NJ (US); Jiangeng Xue, Piscataway, NJ (US); Soichi Uchida, Yokohama (JP); Barry P. Rand, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 173 days.

(21) Appl. No.: 10/979,145

(22) Filed: Nov. 3, 2004

(65) Prior Publication Data

US 2006/0027802 A1 Feb. 9, 2006

Related U.S. Application Data

(63) Continuation-in-part of application No. 10/911,560, filed on Aug. 5, 2004.

(51) Int. Cl.
*H01L 29/08* (2006.01)
*H01L 35/24* (2006.01)
*H01L 51/00* (2006.01)

(52) U.S. Cl. .................. 257/40; 136/243; 136/263

(58) Field of Classification Search ............ None
See application file for complete search history.

(56) References Cited

U.S. PATENT DOCUMENTS

| 5,703,436 | A | 12/1997 | Forrest et al. ............. 313/506 |
| 6,097,147 | A | 8/2000 | Baldo et al. ............. 313/506 |
| 6,333,458 | B1 | 12/2001 | Forrest et al. ............. 136/259 |
| 6,352,777 | B1 | 3/2002 | Bulovic et al. ............. 428/411.1 |
| 6,420,031 | B1 | 7/2002 | Parthasarathy et al. .. 428/411.1 |
| 6,440,769 | B2 | 8/2002 | Peumans et al. ............. 438/65 |
| 6,451,415 | B1 | 9/2002 | Forrest et al. ............. 428/212 |
| 6,580,027 | B2 | 6/2003 | Forrest et al. ............. 136/503 |
| 6,657,378 | B2 | 12/2003 | Forrest et al. ............. 313/503 |
| 6,670,213 | B2 | 12/2003 | Halls et al. ............. 438/52 |
| 7,196,366 | B2 * | 3/2007 | Forrest et al. ............. 257/293 |

(Continued)

FOREIGN PATENT DOCUMENTS

WO   WO 02/101838   12/2002

OTHER PUBLICATIONS

Maennig et al., Organic p-i-n solar cells, Mar. 5, 2004, Appl. Phys. A 79, pp. 1-14.*

(Continued)

*Primary Examiner*—Andy Huynh
*Assistant Examiner*—Hoang-Quan Ho
(74) *Attorney, Agent, or Firm*—Kenyon & Kenyon LLP

(57) ABSTRACT

A device is provided having a first electrode, a second electrode, a first photoactive region having a characteristic absorption wavelength $\lambda_1$ and a second photoactive region having a characteristic absorption wavelength $\lambda_2$. The photoactive regions are disposed between the first and second electrodes, and further positioned on the same side of a reflective layer, such that the first photoactive region is closer to the reflective layer than the second photoactive region. The materials comprising the photoactive regions may be selected such that $\lambda_1$ is at least about 10% different from $\lambda_2$. The device may further comprise an exciton blocking layer disposed adjacent to and in direct contact with the organic acceptor material of each photoactive region, wherein the LUMO of each exciton blocking layer other than that closest to the cathode is not more than about 0.3 eV greater than the LUMO of the acceptor material.

12 Claims, 10 Drawing Sheets

U.S. PATENT DOCUMENTS

2003/0039803 A1* 2/2003 Burroughes ............... 428/137
2005/0038296 A1* 2/2005 Hosokawa et al. ......... 564/426
2006/0027834 A1* 2/2006 Forrest et al. ............. 257/183

OTHER PUBLICATIONS

<http://www.oksolar.com/solar_panels/unisolar_flexibles.htm>, "Uni-solar Flexible (USF) Unbreakable Solar Panels—Triple Junction", printed Sep. 14, 2004.

"Uni-Power Solar Electric Modules Specification Sheet, Models US-64, US-42, US-32", printed from the OKSolar.com website on Sep. 14, 2004 <http://www.oksolar.com/pdf/solar_energy_catalog/unisolar_us-64.pdf>.

"Amorphous Silicon (a-Si) Solar Technology", printed from United Solar Ovonic Corp. website on Sep. 14, 2004, <http://www.uni-solar.com/Our_Technology_a_Si.html>.

S. Guha, et al., "Amorphous Silicon Alloy Photovoltaic Research Present and Future", Progress in Photovoltaics: Research and Applications, Prog. Photovolt. Res. Appl. 8, pp. 141-150 (2000).

Peumans et al., "Small Molecular Weight Organic Thin-Film Photodetectors and Solar Cells," Journal of Applied Physics, vol. 93, No. 7, pp. 3693-3723 (Apr. 1, 2003).

C. W. Tang, "Two-layer organic photovoltaic cell", Appl. Phys. Lett., vol. 48, No. 2, pp. 183-185 (Jan. 1986).

A. Yakimov, et al., " High photovoltage multiple-heterojunction organic solar cells incorporating interfacial metallic nanoclusters", Appl. Phys. Lett., vol. 80, No. 9, pp. 1667-1669 (Mar. 4, 2002).

P. Peumans et al., "Very-high-efficiency double-heterostructure copper phthalocyanine/C60 photovoltaic cells", Appl. Phys. Lett., vol. 79, No. 1, pp. 126-128 (Jul. 2, 2001).

S. E. Shaheen et al., "2.5% efficient organic plastic solar cells", Appl. Phys. Lett., vol. 78, No. 6, pp. 841-843 (Feb. 5, 2001).

P. Peumans et al., "Efficient bulk heterojunction photovoltaic cells using small-molecular-weight organic thin films", Nature, vol. 425, pp. 158-162 (Sep. 11, 2003).

D. Gebeyehu et al., "Bulk-heterojunction photovoltaic devices based on donor-acceptor organic small molecule blends", *Solar Energy Mater. Solar Cells,* 79, pp. 81-92 (2003).

Xue et al., "4.2% efficient organic photovoltaic cells with low series resistances", *Appl. Phys. Lett.,* vol. 84, No. 16, pp. 3013-3015 (Apr. 19, 2004).

M. Hiramoto, et al., "Three-layered organic solar cell with a photoactive interlayer of codeposited pigments", *Appl. Phys. Lett.* 58 (10), pp. 1062-1064 (Mar. 11, 1991).

Forrest, "Ultrathin Organic Films Grown by Organic Molecular Beam Deposition and Related Techniques", *Chem Rev.,* vol. 97, No. 6, pp. 1793-1896 (1997).

Sullivan, et al., "Influence of codeposition on the performance of CuPc-C60 heterojunction photovoltaic devices", *Appl. Phys. Lett.,* vol. 84, No. 7, pp. 1210-1212 (Feb. 16, 2004).

Burrows et al., "Relatioship between electroluminescence and current transport in organic heterojunction light-emitting devices", *J. Appl. Phys.* 79(10), pp. 7991-8006 (May 15, 1996).

Xue et al., "Carrier transport in multilayer organic photodetectors: II. Effects of anode preparation", *J. Appl. Phys.,* vol. 95, No. 4, pp. 1869-1877 (Feb. 15, 2004).

Paasch et al., "Variable range hopping as possible origin of a universal relation between conductivity and mobility in disordered organic semiconductors", *Synthetic Metals,* 132, pp. 97-104 (2002).

G Ruani et al., "Weak instrinsic charge transfer complexes: A new route for developing wide spectrum organic photovoltaic cells", *J. Chem Phys.,* vol. 116, No. 4, pp. 1713-1719 (Jan. 22, 2002).

M. Hiramoto, et al., "p-i-n like behavior in three-layered organic solar cells having a co-deposited interlayer of pigments", J. Appl. Phys., 72 (8), pp. 3781-3787, Oct. 15, 1992.

G. Yu, et al., "Polymer Photovoltaic Cells: Enhanced efficiencies via a network of internal donor-acceptor heterojunctions", *Science,* vol. 270, pp. 1798-1791 (Dec. 15, 1995).

F. Padinger, et al., "Effects of postproduction treatment on plastic solar cells", Adv. Funct. Mater., 13, No. 1, pp. 85-88 (Jan. 2003).

T. Tsuzuki, et al., "The effect of fullerene doping on photoelectric conversion using titanyl phthalocyanine and a perylene pigment", Solar Energy Mater. Solar Cells, 61, pp. 1-8, (2000).

J. Rostalski, et al., "Monochromatic versus solar efficiencies of organic solar cells", Solar Energy Mater. Solar Cells, 61, pp. 87-95 (2000).

Ch. Pannemann, et al., "Electrical characterisation of phthalocyanine-fullerene photovoltaic devices" Synth. Met., 121, pp. 1585-1586 (2001).

Ot. E. Sielcken, et al., "Synthesis and Aggregation Behavior of Hosts Containing Phthalocyanine and Crown Either Subunits", J. Am. Chem. Soc., 109, pp. 4261-4265 (1987).

V. Bulovic et al., "Study of localized and extended excitons in 3,4,9,10-perylenetetracarboxylic dianhydride (PTCDA) II. Photocurrent response at low electric fields", Chem. Phys. 210, pp. 13-25, 1996.

B. A. Gregg et al., "Long-Range singlet energy transfer in perylene Bis(phenethylimide) films", J. Phys. Chem. B, 101, pp. 5362-5369, 1997.

T. Stübinger, et al., "Exciton diffusion and optical interference in organic donor-acceptor photovoltaic cells", J. Appl. Phys., vol. 90, No. 7, pp. 3632-3641, Oct. 1, 2001.

H. R. Kerp and E. E. van Faassen, "Photovoltaic yield from exciton dissociation in organic dye layers", Phys. Chem. Chem. Phys., 1999, 1, pp. 1761-1763.

L. A. A. Pettersson et al., "Modeling photocurrent action spectra of photovoltaic devices based on organic thin films", J. Appl. Phys., vol. 86, No. 1, pp. 487-496, Jul. 1, 1999.

A. L. Burin et al., "Exciton migration and cathode quenching in organic light emitting diodes", J. Phys. Chem. A, 104, pp. 4704-4710, 2000.

V. E. Choong et al., "Photoluminescence quenching of Alq3 by metal deposition: A surface analytical investigation", J. Vac. Sci. Technol. A 16 (3), pp. 1838-1841, May/Jun. 1998.

J. J. M. Halls et al., "Exciton diffusion and dissociation in a poly(p-phenylenevinylene)/C60 heterojunction photovoltaic cell", Appl. Phys. Lett. 68(22), pp. 3120-3122, May 27, 1996.

M. Theander et al., "Photoluminescence quenching at a polythiophene/C60 heterojunction", Phys. Rev. B, vol. 61, No. 19, pp. 12 957-12 963, May 15, 2000.

B. Maennig, et al., "Organic *p-i-n* solar cells", Appl. Phys. A. 79 (2004), pp. 1-14, Mar. 5, 2004.

Pradhan et al., "Molecular level control of donor/acceptor heterostructures in organic photovoltaic devices," Applied Physics Letters, vol. 85, No. 4, pp. 663-665 (Jul. 26, 2004).

http://www.oksolar.com/solar_panels/unisolar_flexibles.htm (pp. 1 to 5).

Uni-Solar, Uni-Power™ Solar Electric Modules Specification sheet as printed from http://www.oksolar.com/pdf/solar_energy_catalog/unisolar_us-64.pdf (pp. 1 to 3).

http://www.uni-solar.com/Our_Technology_a_Si.html (pp. 1 to 2).

Guha et al. Amorphous Silicon Alloy Photovoltaic Research—Present and Future, Prog Photovolt Res. Appl. vol. 8 141-150 (2000).

Peumans et al, "Efficient Photon Harvesting at High Optical Intensities in Ultrathin Organic Double-Heterostructure Photovoltaic Diodes," Applied Physics Letters, vol. 76, pp. 2650-2652 (2000).

Peumans, et al., "Influence of Device Architecture and Interface Morphology on the Power Conversion Efficiency of Small Molecular Photovoltaic Cells", NCPV and Solar Program Review Meeting 2003.

Gary L. Miessler, et al., *Inorganic Chemistry,* 2nd Edition, Prentice-Hall (1998), pp. 1-3, 422-424, 442. [Aug. 1999 version].

U.S. Appl. No. 10/822,774, filed Apr. 13, 2004 to Forrest et al., entitled: Organic Small Molecule Solar Cells with a Homogenously Mixed UCPC: C60.

U.S. Appl. No. 10/723,953, filed Nov. 26, 2003 to Forrest et al., entitled: Multilayer Organic Photodetectors with Improved Performance.

U.S. Appl. No. 10/857,747, filed Jun. 1, 2004 to Peumans et al., entitled: Aperiodic Dielectric Multilayer Stack.

* cited by examiner

STACKED ORGANIC PHOTOSENSITIVE DEVICES

This application is a continuation-in-part of U.S. application Ser. No. 10/911,560 to Forrest, filed Aug. 5, 2004, the subject matter of which is incorporated by reference herein in its entirety.

The claimed invention was made by, on behalf of, and/or in connection with one or more of the following parties to a joint university corporation research agreement: Princeton University, The University of Southern California, and Global Photonic Energy Corporation. The agreement was in effect on and before the date the claimed invention was made, and the claimed invention was made as a result of activities undertaken within the scope of the agreement.

FIELD OF THE INVENTION

The present invention generally relates to organic photosensitive optoelectronic devices. More specifically, it is directed to organic photosensitive optoelectronic devices having increased efficiency.

BACKGROUND OF THE INVENTION

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, (2) the photovoltage under open circuit conditions, i.e., the open circuit voltage $V_{OC}$, and (3) the fill factor, $ff$.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, $ff$, defined as:

$$ff = \{I_{max}V_{max}\}/\{I_{SC}V_{OC}\} \quad (1)$$

where $ff$ is always less than 1, as $I_{SC}$ and $V_{OC}$ are never obtained simultaneously in actual use. Nonetheless, as $ff$ approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = ff*(I_{SC}*V_{OC})/P_{inc}$$

When electromagnetic radiation of an appropriate energy is incident upon a semiconductive organic material, for example, an organic molecular crystal (OMC) material, or a polymer, a photon can be absorbed to produce an excited molecular state. This is represented symbolically as $S_0 + h\nu \Rightarrow S_0^*$. Here $S_0$ and $S_0^*$ denote ground and excited molecular states, respectively. This energy absorption is associated with the promotion of an electron from a bound state in the HOMO energy level, which may be a π-bond, to the LUMO energy level, which may be a π*-bond, or equivalently, the promotion of a hole from the LUMO energy level to the HOMO energy level. In organic thin-film photoconductors, the generated molecular state is generally believed to be an exciton, i.e., an electron-hole pair in a bound state which is transported as a quasi-particle. The excitons can have an appreciable life-time before geminate recombination, which refers to the process of the original electron and hole recombining with each other, as opposed to recombination with holes or electrons from other pairs. To produce a photocurrent the electron-hole pair becomes separated, typically at a donor-acceptor interface between two dissimilar contacting organic thin films. If the charges do not separate, they can recombine in a geminate recombination process, also known as quenching, either radiatively, by the emission of light of a lower energy than the incident light, or non-radiatively, by the production of heat. Either of these outcomes is undesirable in a photosensitive optoelectronic device.

Electric fields or inhomogeneities at a contact may cause an exciton to quench rather than dissociate at the donor-acceptor interface, resulting in no net contribution to the current. Therefore, it is desirable to keep photogenerated excitons away from the contacts. This has the effect of limiting the diffusion of excitons to the region near the junction so that the associated electric field has an increased opportunity to separate charge carriers liberated by the dissociation of the excitons near the junction.

To produce internally generated electric fields which occupy a substantial volume, the usual method is to juxtapose two layers of material with appropriately selected conductive properties, especially with respect to their distribution of molecular quantum energy states. The interface of these two materials is called a photovoltaic heterojunction. In traditional semiconductor theory, materials for forming PV heterojunctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the highest occupied molecular orbital (HOMO) energy level and the lowest unoccupied molecular orbital (LUMO) energy level, called the HOMO-LUMO gap. The Fermi energy characterizes the statistical occupation of molecular quantum energy states denoted by the value of energy for which the probability of occupation is equal to ½. A Fermi energy near the LUMO energy level indicates that electrons are the predominant carrier. A Fermi energy near the HOMO energy level indicates that holes are the predominant carrier. Accordingly, the Fermi energy is a primary characterizing property of traditional semiconductors and the prototypical PV heterojunction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the heterojunction between appropriately selected materials.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

In the context of organic materials, the terms "donor" and "acceptor" refer to the relative positions of the HOMO and LUMO energy levels of two contacting but different organic materials. This is in contrast to the use of these terms in the inorganic context, where "donor" and "acceptor" may refer to types of dopants that may be used to create inorganic n- and p- types layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. Preferably, but not necessarily, an acceptor material is an ETL and a donor material is a HTL.

Conventional inorganic semiconductor PV cells employ a p-n junction to establish an internal field. Early organic thin film cells, such as reported by Tang, *Appl. Phys Lett.* 48, 183 (1986), contain a heterojunction analogous to that employed in a conventional inorganic PV cell. However, it is now recognized that in addition to the establishment of a p-n type junction, the energy level offset of the heterojunction also plays an important role.

The energy level offset at the organic D-A heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$ V/cm) is low. The most efficient exciton dissociation in organic materials occurs at a donor-acceptor (D-A) interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Organic PV cells have many potential advantages when compared to traditional silicon-based devices. Organic PV cells are light weight, economical in materials use, and can be deposited on low cost substrates, such as flexible plastic foils. However, some organic PV devices typically have relatively low external quantum efficiency, being on the order of 1% or less. This is, in part, thought to be due to the second order nature of the intrinsic photoconductive process. That is, carrier generation requires exciton generation, diffusion and ionization or collection. There is an efficiency η associated with each of these processes. Subscripts may be used as follows: P for power efficiency, EXT for external quantum efficiency, A for photon absorption, ED for exciton diffusion, CC for charge collection, and INT for internal quantum efficiency. Using this notation:

$$\eta_P \sim \eta_{EXT} = \eta_A * \eta_{ED} * \eta_{CC}$$

$$\eta_{EXT} = \eta_A * \eta_{INT}$$

The diffusion length ($L_D$) of an exciton is typically much less ($L_D$~50 Å) than the optical absorption length (~500 Å), requiring a trade off between using a thick, and therefore resistive, cell with multiple or highly folded interfaces, or a thin cell with a low optical absorption efficiency.

Typically, when light is absorbed to form an exciton in an organic thin film, a singlet exciton is formed. By the mechanism of intersystem crossing, the singlet exciton may decay to a triplet exciton. In this process energy is lost which will result in a lower efficiency for the device. If not for the energy loss from intersystem crossing, it would be desirable to use materials that generate triplet excitons, as triplet excitons generally have a longer lifetime, and therefore a longer diffusion length, than do singlet excitons.

SUMMARY OF THE INVENTION

A device is provided having a first electrode, a second electrode, a first photoactive region having a characteristic absorption wavelength $\lambda_1$ and a second photoactive region having a characteristic absorption wavelength $\lambda_2$. The photoactive regions are disposed between the first and second electrodes, and further positioned on the same side of a reflective layer, such that the first photoactive region is closer to the reflective layer than the second photoactive region. The materials comprising the photoactive regions may be selected such that $\lambda_1$ is at least about 10% different from $\lambda_2$. The device may further comprise an exciton blocking layer disposed adjacent to and in direct contact with the organic acceptor material of each photoactive region, wherein the LUMO of each exciton blocking layer other than that closest to the cathode is not more than about 0.3 eV greater than the LUMO of the acceptor material.

DETAILED DESCRIPTION

An organic photosensitive optoelectronic device is provided. Organic devices of embodiments of the present invention may be used, for example, to generate a usable electrical current from incident electromagnetic radiation (e.g., PV devices) or may be used to detect incident electromagnetic radiation. Embodiments of the present invention may comprise an anode, a cathode, and a photoactive region between the anode and the cathode. The photoactive region is the portion of the photosensitive device that absorbs electromagnetic radiation to generate excitons that may dissociate in order to generate an electrical current. Organic photosensitive optoelectronic devices may also include at least one transparent electrode to allow incident radiation to be absorbed by the device. Several PV device materials and configurations are described in U.S. Pat. Nos. 6,657,378, 6,580,027, and 6,352,777, which are incorporated herein by reference in their entirety.

Figure 1:
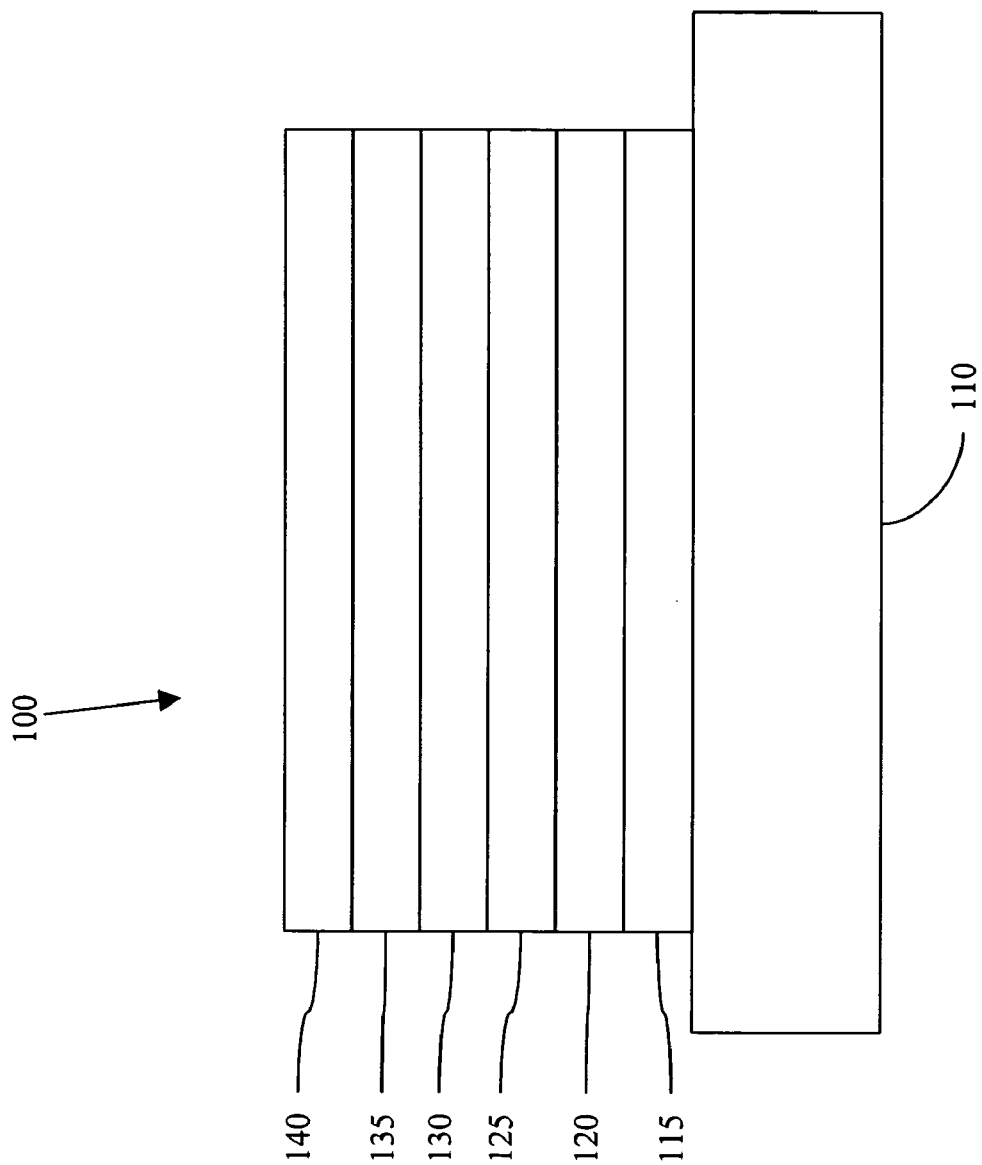
FIG. 1 shows an organic PV device comprising an anode, an anode smoothing layer, a donor layer, an acceptor layer, a blocking layer, and a cathode.

FIG. 1 shows an organic photosensitive optoelectronic device 100. The figures are not necessarily drawn to scale. Device 100 may include a substrate 110, an anode 115, an anode smoothing layer 120, a donor layer 125, an acceptor layer 130, a blocking layer 135, and a cathode 140. Cathode 140 may be a compound cathode having a first conductive layer and a second conductive layer. Device 100 may be fabricated by depositing the layers described, in order. Charge separation may occur predominantly at the organic heterojunction between donor layer 125 and acceptor layer 130. The built-in potential at the heterojunction is determined by the HOMO-LUMO energy level difference between the two materials contacting to form the heterojunction. The HOMO-LUMO gap offset between the donor and acceptor materials produce an electric field at the donor/acceptor interface that facilitates charge separation for excitons created within an exciton diffusion length of the interface.

The specific arrangement of layers illustrated in FIG. 1 is exemplary only, and is not intended to be limiting. For example, some of the layers (such as blocking layers) may be omitted. Other layers (such as reflective layers or additional acceptor and donor layers) may be added. The order of layers may be altered. Arrangements other than those specifically described may be used.

The substrate may be any suitable substrate that provides desired structural properties. The substrate may be flexible or rigid, planar or non-planar. The substrate may be transparent, translucent or opaque. Plastic and glass are examples of preferred rigid substrate materials. Plastic and metal foils are examples of preferred flexible substrate materials. The material and thickness of the substrate may be chosen to obtain desired structural and optical properties.

U.S. Pat. No. 6,352,777, incorporated herein by reference, provides examples of electrodes, or contacts, that may be used in a photosensitive optoelectronic device. When used herein, the terms "electrode" and "contact" refer to layers that provide a medium for delivering photo-generated current to an external circuit or providing a bias voltage to the device. That is, an electrode, or contact, provides the interface between the active regions of an organic photosensitive optoelectronic device and a wire, lead, trace or other means for transporting the charge carriers to or from the external circuit. In a photosensitive optoelectronic device, it is desirable to allow the maximum amount of ambient electromagnetic radiation from the device exterior to be admitted to the photoconductively active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. That is, such a contact should be substantially transparent. The opposing electrode may be a reflective material so that light which has passed through the cell without being absorbed is reflected back through the cell. As used herein, a layer of material or a sequence of several layers of different materials is said to be "transparent" when the layer or layers permit at least 50% of the ambient electromagnetic radiation in relevant wavelengths to be transmitted through the layer or layers. Similarly, layers which permit some, but less that 50% transmission of ambient electromagnetic radiation in relevant wavelengths are said to be "semi-transparent."

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

The electrodes are preferably composed of metals or "metal substitutes". Herein the term "metal" is used to embrace both materials composed of an elementally pure metal, e.g., Mg, and also metal alloys which are materials composed of two or more elementally pure metals, e.g., Mg and Ag together, denoted Mg:Ag. Here, the term "metal substitute" refers to a material that is not a metal within the normal definition, but which has the metal-like properties that are desired in certain appropriate applications. Commonly used metal substitutes for electrodes and charge transfer layers would include doped wide-bandgap semiconductors, for example, transparent conducting oxides such as indium tin oxide (ITO), gallium indium tin oxide (GITO), and zinc indium tin oxide (ZITO). In particular, ITO is a highly doped degenerate n+ semiconductor with an optical bandgap of approximately 3.2 eV, rendering it transparent to wavelengths greater than approximately 3900 Å. Another suitable metal substitute is the transparent conductive polymer polyanaline (PANI) and its chemical relatives. Metal substitutes may be further selected from a wide range of non-metallic materials, wherein the term "non-metallic" is meant to embrace a wide range of materials provided that the material is free of metal in its chemically uncombined form. When a metal is present in its chemically uncombined form, either alone or in combination with one or more other metals as an alloy, the metal may alternatively be referred to as being present in its metallic form or as being a "free metal". Thus, the metal substitute electrodes of the present invention may sometimes be referred to as "metal-free" wherein the term "metal-free" is expressly meant to embrace a material free of metal in its chemically uncombined form. Free metals typically have a form of metallic bonding that results from a sea of valence electrons which are free to move in an electronic conduction band throughout the metal lattice. While metal substitutes may contain metal constituents they are "non-metallic" on several bases. They are not pure free-metals nor are they alloys of free-metals. When metals are present in their metallic form, the electronic conduction band tends to provide, among other metallic properties, a high electrical conductivity as well as a high reflectivity for optical radiation.

Embodiments of the present invention may include, as one or more of the transparent electrodes of the photosensitive optoelectronic device, a highly transparent, non-metallic, low resistance cathode such as disclosed in U.S. Pat. No. 6,420,031, to Parthasarathy et al. ("Parthasarathy '031"), or a highly efficient, low resistance metallic/non-metallic compound cathode such as disclosed in U.S. Pat. No. 5,703,436 to Forrest et al. ("Forrest '436"), both incorporated herein by reference in their entirety. Each type of cathode is preferably prepared in a fabrication process that includes the step of sputter depositing an ITO layer onto either an organic material, such as copper phthalocyanine (CuPc), to form a highly transparent, non-metallic, low resistance cathode or onto a thin Mg:Ag layer to form a highly efficient, low resistance metallic/non-metallic compound cathode.

Herein, the term "cathode" is used in the following manner. In a non-stacked PV device or a single unit of a stacked PV device under ambient irradiation and connected with a resistive load and with no externally applied voltage, e.g., a PV device, electrons move to the cathode from the photo-conducting material. Similarly, the term "anode" is used herein such that in a PV device under illumination, holes move to the anode from the photo-conducting material, which is equivalent to electrons moving in the opposite manner. It will be noted that as the terms are used herein, anodes and cathodes may be electrodes or charge transfer layers.

An organic photosensitive device will comprise at least one photoactive region in which light is absorbed to form an excited state, or "exciton", which may subsequently dissociate in to an electron and a hole. The dissociation of the exciton will typically occur at the heterojunction formed by the juxtaposition of an acceptor layer and a donor layer. For example, in the device of FIG. 1, the "photoactive region" may include donor layer 125 and acceptor layer 130.

The acceptor material may be comprised of, for example, perylenes, naphthalenes, fullerenes or nanotubules. An example of an acceptor material is 3,4,9,10-perylenetetracarboxylic bis-benzimidazole (PTCBI). Alternatively, the acceptor layer may be comprised of a fullerene material as described in U.S. Pat. No. 6,580,027, incorporated herein by reference in its entirety. Adjacent to the acceptor layer, is a layer of organic donor-type material. The boundary of the acceptor layer and the donor layer forms the heterojunction which may produce an internally generated electric field. The material for the donor layer may be a pthalocyanine or a porphyrin, or a derivative or transition metal complex thereof, such as copper pthalocyanine (CuPc). Other suitable acceptor and donor materials may be used.

Through the use of an organometallic material in the photoactive region, devices incorporating such materials may efficiently utilize triplet excitons. It is believed that the singlet-triplet mixing may be so strong for organometallic compounds, that the absorptions involve excitation from the singlet ground states directly to the triplet excited states, eliminating the losses associated with conversion from the singlet excited state to the triplet excited state. The longer lifetime and diffusion length of triplet excitons in comparison to singlet excitons may allow for the use of a thicker photoactive region, as the triplet excitons may diffuse a greater distance to reach the donor-acceptor heterojunction, without sacrificing device efficiency. Materials other than organometallics may also be used.

In a preferred embodiment of the invention, the stacked organic layers include one or more exciton blocking layers (EBLs) as described in U.S. Pat. No. 6,097,147, Peumans et al, *Applied Physics Letters* 2000, 76, 2650-52, and co-pending application Ser. No. 09/449,801, filed Nov. 26, 1999, both incorporated herein by reference. Higher internal and external quantum efficiencies have been achieved by the inclusion of an EBL to confine photogenerated excitons to the region near the dissociating interface and to prevent parasitic exciton quenching at a photosensitive organic/electrode interface. In addition to limiting the volume over which excitons may diffuse, an EBL can also act as a diffusion barrier to substances introduced during deposition of the electrodes. In some circumstances, an EBL can be made thick enough to fill pinholes or shorting defects which could otherwise render an organic PV device non-functional. An EBL can therefore help protect fragile organic layers from damage produced when electrodes are deposited onto the organic materials.

It is believed that the EBLs derive their exciton blocking property from having a LUMO-HOMO energy gap substantially larger than that of the adjacent organic semiconductor from which excitons are being blocked. Thus, the confined excitons are prohibited from existing in the EBL due to energy considerations. While it is desirable for the EBL to block excitons, it is not desirable for the EBL to block all charge. However, due to the nature of the adjacent energy levels, an EBL may block one sign of charge carrier. By design, an EBL will exist between two other layers, usually an organic photosensitive semiconductor layer and a electrode or charge transfer layer. The adjacent electrode or charge transfer layer will be in context either a cathode or an anode. Therefore, the material for an EBL in a given position in a device will be chosen so that the desired sign of carrier will not be impeded in its transport to the electrode or charge transfer layer. Proper energy level alignment ensures that no barrier to charge transport exists, preventing an increase in series resistance. For example, it is desirable for a material used as a cathode side EBL to have a LUMO energy level closely matching the LUMO energy level of the adjacent ETL material so that any undesired barrier to electrons is minimized.

It should be appreciated that the exciton blocking nature of a material is not an intrinsic property of its HOMO-LUMO energy gap. Whether a given material will act as an exciton blocker depends upon the relative HOMO and LUMO energy levels of the adjacent organic photosensitive material. Therefore, it is not possible to identify a class of compounds in isolation as exciton blockers without regard to the device context in which they may be used. However, with the teachings herein one of ordinary skill in the art may identify whether a given material will function as an exciton blocking layer when used with a selected set of materials to construct an organic PV device.

In a preferred embodiment of the invention, an EBL is situated between the acceptor layer and the cathode. A preferred material for the EBL comprises 2,9-dimethyl-4,7-diphenyl-1,10-phenanthroline (also called bathocuproine or BCP), which is believed to have a LUMO-HOMO energy level separation of about 3.5 eV, or bis(2-methyl-8-hydroxyquinolinoato)-aluminum(III)phenolate ($Alq_2OPH$). BCP is an effective exciton blocker which can easily transport electrons to the cathode from an acceptor layer.

The EBL layer may be doped with a suitable dopant, including but not limited to 3,4,9,10-perylenetracarboxylic dianhydride (PTCDA), 3,4,9,10-perylenetracarboxylic diimide (PTCDI), 3,4,9,10-perylenetetracarboxylic-bis-benzimidazole (PTCBI), 1,4,5,8-naphthalenetetracarboxylic dianhydride (NTCDA), and derivatives thereof. It is thought that the BCP as deposited in the present devices is amorphous. The present apparently amorphous BCP exciton blocking layers may exhibit film recrystallization, which is especially rapid under high light intensities. The resulting morphology change to polycrystalline material results in a lower quality film with possible defects such as shorts, voids or intrusion of electrode material. Accordingly, it has been found that doping of some EBL materials, such as BCP, that exhibit this effect with a suitable, relatively large and stable molecule can stabilize the EBL structure to prevent performance degrading morphology changes. It should be further appreciated that doping of an EBL which is transporting electrons in a giving device with a material having a LUMO energy level close to that of the EBL will help insure that electron traps are not formed which might produce space charge build-up and reduce performance. Additionally, it should be appreciated that relatively low doping densities should minimize exciton generation at isolated dopant sites. Since such excitons are effectively prohibited from diffusing by the surrounding EBL material, such absorptions reduce device photoconversion efficiency.

Representative embodiments may also comprise transparent charge transfer layers or charge recombination layers. As described herein charge transfer layers are distinguished from acceptor and donor layers by the fact that charge transfer layers are frequently, but not necessarily, inorganic (often metals) and they may be chosen not to be photoconductively active. The term "charge transfer layer" is used herein to refer to layers similar to but different from electrodes in that a charge transfer layer only delivers charge carriers from one subsection of an optoelectronic device to the adjacent subsection. The term "charge recombination layer" is used herein to refer to layers similar to but different from electrodes in that a charge recombination layer allows for the recombination of electrons and holes between tandem photosensitive devices and may also enhance internal optical field strength near one or more active layers. A charge recombination layer can be constructed of semi-transparent metal nanoclusters, nanoparticle or nanorods as described in U.S. Pat. No. 6,657,378, incorporated herein by reference in its entirety.

In a preferred embodiment of the invention, an anode-smoothing layer is situated between the anode and the donor layer. A preferred material for this layer comprises a film of 3,4-polyethylenedioxythiophene:polystyrenesulfonate (PEDOT:PSS). The introduction of the PEDOT:PSS layer between the anode (ITO) and the donor layer (CuPc) may lead to greatly improved fabrication yields. This is attributed to the ability of the spin-coated PEDOT:PSS film to planarize the ITO, whose rough surface could otherwise result in shorts through the thin molecular layers.

In a further embodiment on the invention, one or more of the layers may be treated with plasma prior to depositing the next layer. The layers may be treated, for example, with a mild argon or oxygen plasma. This treatment is beneficial as it reduces the series resistance. It is particularly advantageous that the PEDOT:PSS layer be subject to a mild plasma treatment prior to deposition of the next layer.

The simple layered structure illustrated in FIG. 1 is provided by way of non-limiting example, and it is understood that embodiments of the invention may be used in connection with a wide variety of other structures. The specific materials and structures described are exemplary in nature, and other materials and structures may be used. Functional devices may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. Organic layers that are not a part of the photoactive region, i.e., organic layers that generally do not absorb photons that make a significant contribution to photocurrent, may be referred to as "non-photoactive layers." Examples of non-photoactive layers include EBLs and anode-smoothing layers. Other types of non-photoactive layers may also be used.

Preferred organic materials for use in the photoactive layers of a photosensitive device include cyclometallated organometallic compounds. The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic refers to compounds which have an organic group bonded to a metal through a carbon-metal bond. This class does not include per se coordination compounds, which are substances having only donor bonds from heteroatoms, such as metal complexes of amines, halides, pseudohalides (CN, etc.), and the like. In practice organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN or CO. The term cyclometallated refers to compounds that comprise an bidentate organometallic ligand so that, upon bonding to a metal, a ring structure is formed that includes the metal as one of the ring members.

Organic layers may be fabricated using vacuum deposition, spin coating, organic vapor-phase deposition, inkjet printing and other methods known in the art.

Organic photosensitive optoelectronic devices may function as a PV, photodetector or photoconductor. Whenever the organic photosensitive optoelectronic devices of the present invention function as a PV device, the materials used in the photoconductive organic layers and the thicknesses thereof may be selected, for example, to optimize the external quantum efficiency of the device. Whenever the organic photosensitive optoelectronic devices of the present invention function as photodetectors or photoconductors, the materials used in the photoconductive organic layers and the thicknesses thereof may be selected, for example, to maximize the sensitivity of the device to desired spectral regions.

This result may be achieved by considering several guidelines that may be used in the selection of layer thicknesses. It is desirable for the exciton diffusion length, $L_D$, to be greater than or comparable to the layer thickness, L, since it is believed that most exciton dissociation will occur at an interface. If $L_D$ is less than L, then many excitons may recombine before dissociation. It is further desirable for the total photoconductive layer thickness to be of the order of the electromagnetic radiation absorption length, $1/\alpha$ (where $\alpha$ is the absorption coefficient), so that nearly all of the radiation incident on the PV device is absorbed to produce excitons. Furthermore, the photoconductive layer thickness should be as thin as possible to avoid excess series resistance due to the high bulk resistivity of organic semiconductors.

Accordingly, these competing guidelines inherently require tradeoffs to be made in selecting the thickness of the photoconductive organic layers of a photosensitive optoelectronic cell. Thus, on the one hand, a thickness that is comparable or larger than the absorption length is desirable (for a single cell device) in order to absorb the maximum amount of incident radiation. On the other hand, as the photoconductive layer thickness increases, two undesirable effects are increased. One is that due to the high series resistance of organic semiconductors, an increased organic layer thickness increases device resistance and reduces efficiency. Another undesirable effect is that increasing the photoconductive layer thickness increases the likelihood that excitons will be generated far from the effective field at a charge-separating interface, resulting in enhanced probability of geminate recombination and, again, reduced efficiency. Therefore, a device configuration is desirable which balances between these competing effects in a manner that produces a high external quantum efficiency for the overall device.

The organic photosensitive optoelectronic devices of the present invention may function as photodetectors. In this embodiment, the device may be a multilayer organic device, for example as described in U.S. application Ser. No. 10/723,953, filed Nov. 26, 2003, incorporated herein by reference in its entirety. In this case an external electric field may be generally applied to facilitate extraction of the separated charges.

A concentrator or trapping configuration can be employed to increase the efficiency of the organic photosensitive optoelectronic device, where photons are forced to make multiple passes through the thin absorbing regions. U.S. Pat. Nos. 6,333,458 and 6,440,769, incorporated herein by reference in their entirety, addresses this issue by using structural designs that enhance the photoconversion efficiency of photosensitive optoelectronic devices by optimizing the optical geometry for high absorption and for use with optical concentrators that increase collection efficiency. Such geometries for photosensitive devices substantially increase the optical path through the material by trapping the incident radiation within a reflective cavity or waveguiding structure, and thereby recycling light by multiple reflection through the photoresponsive material. The geometries disclosed in U.S. Pat. Nos. 6,333,458 and 6,440,769 therefore enhance the external quantum efficiency of the devices without causing substantial increase in bulk resistance. Included in the geometry of such devices is a first reflective layer; a transparent insulating layer which should be longer than the optical coherence length of the incident light in all dimensions to prevent optical microcavity interference effects; a transparent first electrode layer adjacent the transparent insulating layer; a photosensitive heterostructure adjacent the transparent electrode; and a second electrode which is also reflective.

Coatings may be used to focus optical energy into desired regions of a device. U.S. patent application Ser. No. 10/857,747, which is incorporated by reference in its entirety, provides examples of such a coating.

The power conversion efficiency ($\eta_P$) of organic cells may be improved through the use of new materials and the introduction of novel device structures. The efficiency of organic cells may be improved by using the acceptor material $C_{60}$ with a long exciton diffusion length ($L_D \approx 400$ Å), or by forming a bulk heterojunction structure, where an interpenetrating network of donor and acceptor materials enhances the probability of excitons diffusing to a nearby, "local" D-A interface. One embodiment of the present invention provides a copper phthalocyanine (CuPc)/$C_{60}$ organic cell incorporating a hybrid planar-mixed heterojunction (PM-HJ), consisting of a mixed D-A layer sandwiched between homogeneous donor and acceptor layers. The device demonstrates $\eta_P$=5% under simulated AM1.5G solar illumination.

Stacking two or more cells in series is one way to harvest more photons while increasing the open-circuit voltage ($V_{OC}$) of the cell. A more than doubling of individual CuPc/PTCBI cell efficiencies of $\eta_P$=1% to $\eta_P$=2.5% has been demonstrated, as described in A. Yakimov and S. R. Forrest, Appl. Phys. Lett. 80, 1667 (2002), by stacking two thin cells in series, with Ag nanoclusters between the subcells providing both optical field enhancement and efficient recombination sites for the photogenerated charges. The photovoltage of this "tandem" cell may be twice that of each individual cell (or subcell). One embodiment of the present invention comprises two CuPc/$C_{60}$ hybrid PM-HJ cells in series, with each cell having a different ratio of CuPc to $C_{60}$. This configuration results in $\eta_P$=(5.7±0.3)% under 1 sun=100 mW/cm² simulated AM1.5G solar illumination, representing ~15% increase from a single hybrid PM-HJ cell. Also, $V_{OC}$ of the tandem cell is greater than that of a single PV cell, reaching up to about 1.2 V under high intensity illumination. One embodiment of the present invention employs the highly efficient material combination of CuPc and $C_{60}$ in hybrid planar-mixed double heterojunction structures. Without including antireflection coatings on the substrates, organic PV cells with solar power conversion efficiencies of 6.5% may be possible using tandem structures of this type.

A two-subcell CuPc/PTCBI tandem cell has symmetric spectral response from each of the two subcells. The optical interference between the incident light and that reflected from the metal cathode leads to a maximum optical intensity at a perpendicular optical path length of $\lambda/4$ from the organic/cathode interface, where $\lambda$ is the incident light wavelength. As used herein, "perpendicular optical path length" refers to distance/n, measured normal to the surface of the device and integrated over the path traveled by light, where n is the index of refraction of the material and may vary within the material. Hence, an "asymmetric" tandem cell with a front cell rich in long-wavelength absorbing molecules, and a back cell rich in short-wavelength absorbing molecules, may absorb more incident light than an otherwise equivalent tandem cell having equal mixtures of CuPc and $C_{60}$ in each subcell. For example, if CuPc absorbs between $\lambda$=550 nm and 750 nm, and $C_{60}$ between $\lambda$=350 nm and 550 nm, an asymmetric CuPc/$C_{60}$ hybrid PM-HJ tandem cell may include a front cell with a thicker homogeneous CuPc layer and a thinner $C_{60}$ layer than the back cell. A tradeoff between the homogeneous and mixed layer thicknesses may also be used to balance the photocurrent in the two subcells, due to the short exciton diffusion lengths in the homogeneous layers and the low charge mobilities in the mixed layers.

The efficiency of a CuPc/$C_{60}$ hybrid PM-HJ tandem cell may be maximized by modeling the current density vs. voltage (J-V) characteristics of subcell i (i =1,2 denoting the front and back cell, respectively) following:

$$J_i(V_i) = J_{d,i}(V_i) + J_{Ph,i}(V_i) \quad (1)$$

$$= J_{s,i}\left\{\exp\left[\frac{q(V_i - J_i R_{S,i})}{n_i kT}\right] - 1\right\} + J_{Ph,i}^0 \eta_{CC,i}(V_i),$$

where $J_{d,i}$ and $J_{ph,i}$ are the dark and photo current densities, respectively, $J_{s,i}$ is the reverse-bias saturation current, $n_i$ is the ideality factor, $R_{S,i}$ is the cell series resistance, q is the electron charge, k is Boltzmann's constant, and T is the temperature. Using a model that considers both optical interference and exciton diffusion, the photocurrent density $J_{Ph,i}^0$ under an incident optical power density $P_O$ may be obtained, assuming all photogenerated charges are collected at the electrodes. This assumption may not hold for a cell with a mixed layer, where charge carrier mobilities are significantly reduced from those in homogeneous layers due to molecular intermixing, leading to recombination of photogenerated charges within the mixed layer. The charge collection efficiency $\eta_{cc}$, or the proportion of charges collected at the electrodes, as a function of the applied voltage V and the mixed layer thickness $d_m$ is $$\eta_{CC}(V) = \frac{L_c(V)}{d_m}\left\{1 - \exp\left[-\frac{d_m}{L_c(V)}\right]\right\}, \quad (2)$$

where $L_c(V)=L_{co}(V_{bi}-V)/V$ is the charge collection length, $L_\infty$ is a constant, and $V_{bi}$ is the built-in potential. Given $J_i^\infty=J_i(V_i)$ (i=1,2), the J-V characteristics of the tandem cell are obtained from the requirement that $J=J_1=J_2$, and $V=V_1+V_2$, from which the PV cell performance parameters (short-circuit current density $J_{sc}$, open-circuit voltage $V_{oc}$, fill factor FF, and power conversion efficiency $\eta p$) are obtained.

Table 1 provides the device structures of three tandem cells. Table 2 summarizes the parameter values used in the model. Referring to Table 1, cell A has mixed layer thicknesses based on given asymmetric homogeneous layer thicknesses, leading to $\eta_P$=5.2% under 1 sun AM1.5G solar illumination. The combination of photoactive layer thicknesses in cell B leads to a higher efficiency of $\eta_P$=5.0%. A PTCBI layer in the front cell may also contribute to the photocurrent when the front-cell homogeneous $C_{60}$ layer is removed, so that CuPc molecules in the mixed layer may form an exciton dissociation interface with PTCBI. This leads to a higher $J_{SC}$ and a maximum $\eta_P$=6.5% in cell C, as the PTCBI absorption fills the gap between the absorption regions of CuPc and $C_{60}$, at around $\lambda$=550 nm.

230. In a preferred embodiment of the invention, intervening layer 240 comprises a charge recombination zone. In another preferred embodiment, intervening layer 240 may comprise one or more electrodes, where multiple electrodes may be separated by an insulating layer.

In another embodiment of the present invention, the mixture of the organic acceptor material and the organic donor material in a mixed organic layer, such as organic layer 232 may occur in a ratio ranging from about 10:1 to about 1:10 by weight, respectively. In one embodiment, an organic layer including a mixture of acceptor and donor materials (such as organic layer 232), and an organic layer that includes only an acceptor material or a donor material (such as second organic layer 231 or 233) may be present.

Figure 10:
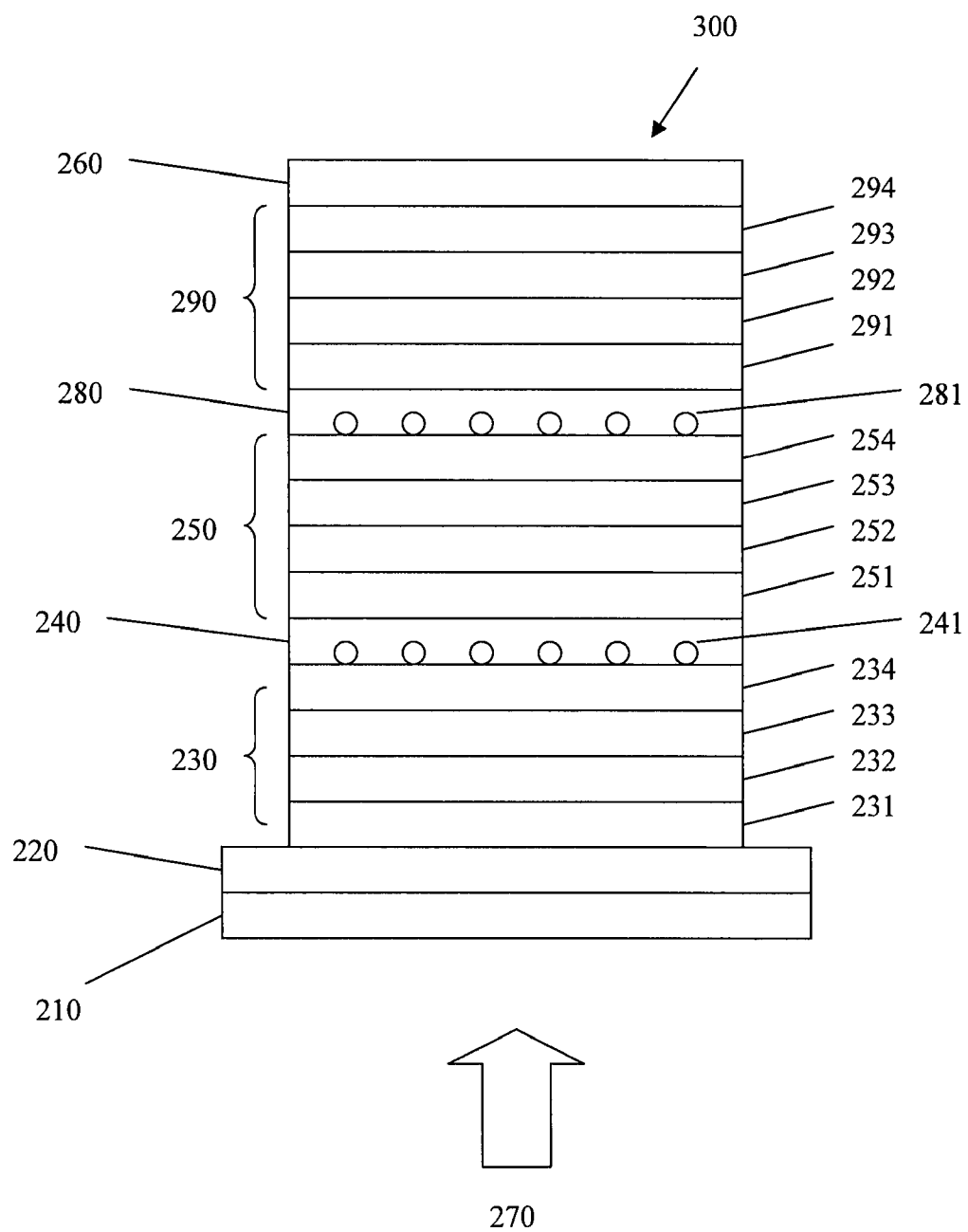
FIG. 10 shows a device having three photoactive regions.

FIG. 10 shows an organic photoactive device 300 according to yet another embodiment of the present invention. As in device 200 shown in FIG. 2, device 300 includes first and second photoactive regions 230 and 250, along with substrate 210, first electrode 220, second electrode 260, and intervening layer 240. In addition, device 300 includes a third photoactive region 290, which comprises an organic

TABLE 1

| Cell label | Front cell | | | | Back cell | | | | $J_{SC}$ (mA/cm$^2$) | $V_{OC}$ (V) | FF | $\eta_P$ (%) |
|---|---|---|---|---|---|---|---|---|---|---|---|---|
| | CuPc | CuPc:C$_{60}$ | C$_{60}$ | PTCBI | CuPc | CuPc:C$_{60}$ | C$_{60}$ | BCP | | | | |
| A | 100 | 180 | 20 | 50 | 20 | 130 | 250 | 75 | 9.4 | 1.03 | 0.54 | 5.2 |
| B | 75 | 125 | 80 | 50 | 60 | 130 | 160 | 75 | 9.7 | 1.03 | 0.59 | 5.9 |
| C | 90 | 110 | 0 | 50 | 50 | 100 | 210 | 100 | 10.3 | 1.04 | 0.61 | 6.5 |

TABLE 2

| $J_s$ (nA/cm$^2$) | $R_S$ ($\Omega \cdot$ cm$^2$) | n | $L_{c0}$ (Å) | $V_{bi}$ (V) | $L_D$ (Å) | | |
|---|---|---|---|---|---|---|---|
| | | | | | CuPc | C$_{60}$ | PTCBI |
| 35 | 0.25 | 1.6 | 400 | 0.65 | 80 | 400 | 30 |

In one embodiment of the invention, photoactive regions are disposed between two electrodes. In preferred embodiments of the invention, the photoactive regions comprise hybrid planar-mixed heterojunction (PM-HJ) devices, as described in U.S. patent application Ser. No. 10/822774, incorporated herein by reference in its entirety.

Figure 2:
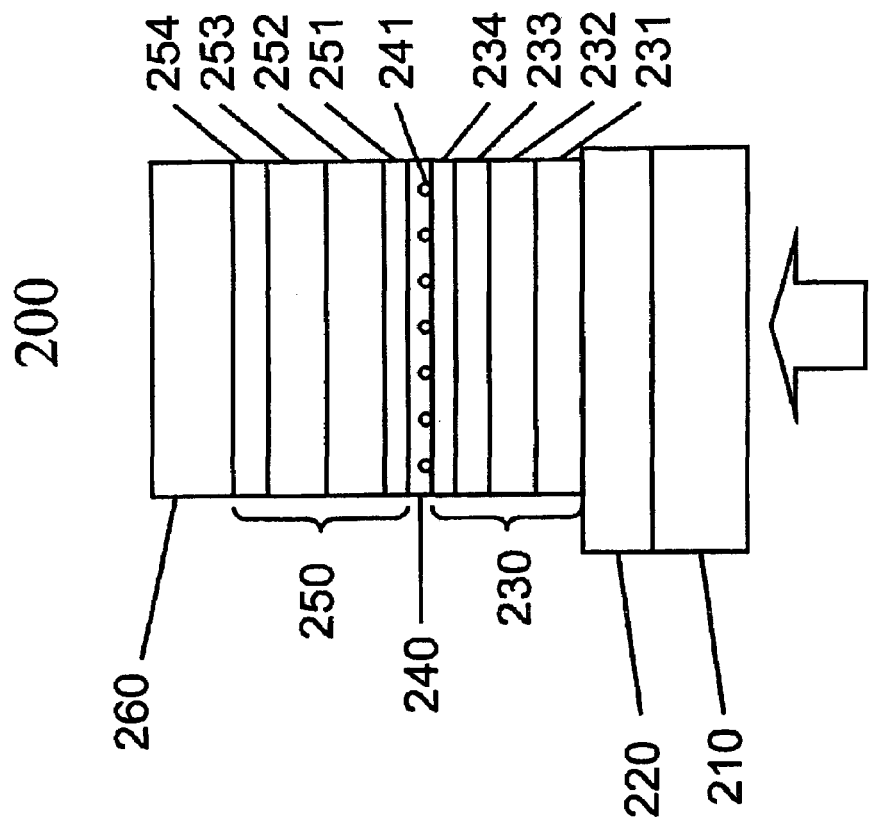
FIG. 2 shows an organic tandem device formed by stacking two cells in series.

FIG. 2 shows an organic photoactive device 200 according to one embodiment of the invention. Device 200 may comprise a substrate 210 on which is deposited a first electrode 220, a first (or "front") organic photoactive region 230, an intervening layer 240, a second (or "back") photoactive region 250, and a second electrode 260. The organic photoactive regions 230 and 250 comprise an organic acceptor material and an organic donor material. In preferred embodiments of the invention, the first photoactive region 230 further comprises a first organic layer 231 comprising an unmixed organic acceptor material; a second organic layer 232 comprising a mixture of the organic acceptor material of unmixed organic acceptor layer 231 and an organic donor material; a third organic layer 233, comprising the unmixed donor material of second organic layer 232; and an exciton blocking layer 234. In other preferred embodiments, acceptor layers 231 and 251 or donor layers 233 and 253 may be absent. In another preferred embodiment of the invention, the second photoactive region 250 comprises a similar arrangement of organic materials as first photoactive region layer 291 of unmixed acceptor material, an organic layer 292 of mixed acceptor and donor material, and an organic layer 293 of unmixed donor material. Device 300 further includes an additional exciton blocking layer 294 and an additional intervening layer 280 which contains nanoparticles 281.

When an EBL is deposited in a layer adjacent to and in direct contact with a deposited cathode, the EBL may be damaged. This damage is believed to be advantageous in that it may allow charge carriers to pass across the EBL more easily, while still preventing excitons from doing so. It is believed that selecting materials for the EBL and organic acceptor layers such that the LUMO of each EBL is not more than about 0.3 eV greater than the LUMO of the adjacent acceptor material produces a similar result. To obtain favorable charge transport properties, it is therefore preferable that an EBL disposed adjacent to an acceptor layer is (1) not separated from the second electrode by a photoactive region; and/or (2) has a LUMO not more than about 0.3 eV greater than the LUMO of an adjacent photoactive region. If a particular EBL is not separated from the second electrode by a photoactive region, such that the EBL is subject to damage during deposition of the second electrode, the LUMO difference between the EBL and the acceptor is less important and the criteria used to select the EBL material may be weighted more towards factors other than LUMO.

In a preferred embodiment of the device, the second exciton blocking layer 254 comprises a different material than the first exciton blocking layer 234. Because exciton blocking layer 254 is not separated from the second electrode by a photoactive region, a broader selection of materials may be available. The material of exciton blocking material 254 may have a LUMO of not more than about 0.3 eV greater than the LUMO of organic acceptor layer 253, or it may have a LUMO that is greater, bt charge transport may still be favorable due to damage caused by the deposition of the second electrode 260. Preferred materials for exciton blocking layer 254 include BCP, and preferred materials for exciton blocking layer 234 include PTCBI.

In another embodiment of the invention, organic cell 200 further comprises an intervening layer 240. Intervening layer 240 may comprise a charge recombination zone. In a preferred embodiment of the invention, the charge recombination zone comprises a p-doped organic material, such as m-MTDATA:$F_4$-TCNQ or BTQBT:PTCDA, and the charge recombination zone further comprises nanoparticles 241. It is especially preferred that the nanoparticles comprise Ag or another metal or metallic material. Other materials may be used.

In a tandem cell, it may be advantageous to use different acceptor and donor materials, or the same acceptor and donor materials in different ratios, in each subcell. Using different materials or different ratios of the same materials may allow the cell to absorb light in a greater range of wavelengths than if the same materials in the same ratios are used in each subcell. In a preferred embodiment of the invention, organic regions 230 and 250 comprise different acceptor and donor materials. Organic regions 230 and 250 may also comprise the same acceptor and donor materials, wherein the mixed organic layers 232 and 252 comprise different ratios of the acceptor and donor materials. The organic acceptor material of organic regions 230 and 250 may be $C_{60}$. The organic donor material of photoactive regions 230 and 250 may be CuPc. Other suitable organic donor materials include lead phthalocyanine (PbPc), metal containing porphyrins, metal-free porphyrins, rubrene, metal containing phthalocyanines, metal-free phthalocyanines, diamines (such as NPD), and functionalized variants thereof, including naphthalocyanines. Other suitable organic acceptor materials include PTCBI, $C_{70}$, fullerenes, perylenes, catacondensed conjugated molecular systems such as linear polyacenes (including anthracene, napthalene, tetracene, and pentacene), pyrene, coronene, and functionalized variants thereof. This listing is not meant to be comprehensive, and other suitable acceptor and donor materials may be used.

In an especially preferred embodiment of the present invention, the anode comprises a transparent, conducting indium-tin-oxide (ITO) layer on a glass substrate, and the cathode comprises a 1000 Å thick thermally evaporated Ag electrode. The photoactive region of each subcell comprises a hybrid PM-HJ, i.e., a mixed CuPc:$C_{60}$ layer disposed between homogeneous CuPc and $C_{60}$ layers, which combines the advantages of a planar HJ between homogeneous layers (good transport of photogenerated charge carriers to their respective electrodes) and a mixed layer (high exciton diffusion efficiency). A thin layer of 3,4,9,10-perylenetetracarboxylic bis-benzimidazole (PTCBI) and bathocuproine (BCP) is used as the exciton-blocking layer (EBL) in the front (nearest the ITO) and back (nearest the cathode) subcells, respectively, thereby forming a high efficiency double heterojunction PV structure. A charge recombination zone for electrons generated in the front cell and holes generated in the back cell is disposed between the subcells. The recombination centers comprise Ag nanoclusters deposited in an ultrathin (~5 Å, average thickness) layer disposed in a 50 Å thick 4,4',4''-tris(3-methyl-phenyl-phenyl-amino) triphenylamine (m-MTDATA) p-doped with 5 mol % tetrafluoro-tetracyano-quinodimethane ($F_4$-TCNQ). Device fabrication procedures and methods of characterization may be those known in the art.

It is understood that the embodiments described herein are exemplary only, and that other embodiments may be used in accordance with the present invention. For example, the order of the layers illustrated may be altered. For example, the positions of the organic layers 230 and 250 may be switched, with appropriate repositioning of blocking layers, etc. Additional layers may or may not also be present, such as blocking layers, charge recombination layers, etc. For example, blocking layers may be removed, and/or additional blocking layers may be present. Non-organic regions may be present, and may be used to adjust the position of the organic regions relative to a reflecting layer. Different materials than those specifically described may be used. For example, a device where all of the electrodes are ITO may be fabricated such that the device may be transparent to some degree. Additionally, the device could be fabricated onto a substrate, and then applied to a supporting surface, such that the last electrode deposited is closest to the supporting surface. Acceptor and donor layers may not be present. For example, donor or acceptor layers 231, 251, 233, and 253 may be absent. Although many embodiments are described with respect to solar cells, other embodiments may be used in other types of devices, such as a photodetector.

Where a layer is described as an "unmixed" acceptor or donor layer, the "unmixed" layer may include very small amounts of the opposite material as an impurity. A material may be considered an impurity if the concentration is significantly lower than the amount needed for percolation in the layer, i.e., less than about 5% by weight. Preferably, any impurity is present in a much lower amount, such as less than 1% by weight or most preferably less than about 0.1% by weight. Depending upon the processes and process parameters used to fabricate devices, some impurities of the materials in immediately adjacent layers may be unavoidable.

Organic materials may have absorption spectra with maxima at specific wavelengths. As used herein, the term "characteristic absorption wavelength" refers to the wavelength at which the absorption spectrum of a material has a maximum.

Device 200 may include at least one reflective layer. In one embodiment of the invention, second electrode 260 is a reflective layer. Other configurations may be used, such as the use of a separate reflective layer, or a top emitting (or absorbing) device where the substrate or the first electrode is the reflective layer. A "reflective" layer may be a metal layer, or another type of layer that reflects, such as an aperiodic or periodic dielectric stack. The use of a reflective layer leads to an optical field strength that varies with wavelength and with position in a direction perpendicular to the reflective layer. For any given wavelength, there are maxima in the optical field strength as a function of position. See, for example, FIG. 3. For photosensitive devices, it is desirable to locate a photoactive region having a particular characteristic absorption wavelength such that the position having a maximum as a function of position for that wavelength is located within or near the photoactive region. For a photoactive region having multiple materials, the characteristic absorption wavelength is based on the maxima of the absorption spectra of the entire region. "Near" may mean, for example, at a distance that is not more than about 0.05 $\lambda/n$ from the photoactive region in question, where n is the index of refraction of the material in which the maximum occurs. Preferably, the maximum is disposed within the photoactive region. Locating the photoactive region in this manner will lead to enhanced absorption. For some applications, it is desirable to use light absorbing regions that have significantly different characteristic absorption wavelengths. Such a difference may allow for absorption of a broader range of wavelengths. In one embodiment of the invention, organic regions 250 and 230 have characteristic absorption wavelengths at $\lambda_1$ and $\lambda_2$, respectively. It is preferred that $\lambda_1$ be at least about 10% different from $\lambda_2$. Characteristic absorption wavelength is only one way of quantifying "different" absorption spectra. Another way of quantifying different absorption spectra is that the wavelength of at least one of the top three absorption peaks of one photoactive region is at least 10% different from all of the wavelengths of the top 3 absorption peaks of another photoactive region. Yet another way to quatify different absorption spectra is to superimpose two normalized spectra on each other, and to measure the area that overlaps. It this overlap area is 80% or less of the total area of one of the spectra, the spectra can be considered significantly different. For example, two materials may have similar characteristic absorption wavelengths, but other features (such as subpeaks) that are significantly different, and possibly complementary for purposes of absorbing a broad spectra of incident light. Such an embodiment is intended to be within the scope of certain aspects of the invention.

Many photoactive materials (and combinations of materials, for photoactive regions having multiple materials) may have a plurality of absorption peaks. A photoactive region that strongly absorbs a particular wavelength of light may be placed at a position where the optical field strength for that wavelength is strong. In one embodiment, a local peak in the absorption spectra of a photoactive region is used to determine a favorable position for the photoactive region. The photoactive region may be located at or near a maximum in the optical field intensity for the wavelength for which the photoactive region has a local maximum. For devices intended to absorb the solar spectrum, wavelengths between 350 and 1300 nm may be of greater importance. In general terms, it is preferable to increase or maximixe the overlap of optical field intensity at a particular wavelength or range of wavelengths with a photoactive region that is a strong absorber of those wavelengths. One way to achieve this is adjusting the position of a photoactive region towards a position where there is a greater overlap between the absorption of the photoactive region and the optical field intensity (both as functions of wavelength). Another way is to alter the absorption characteristics of a photoactive region by altering the materials therein, or the ratio of materials, to achieve a greater overlap between the absorption spectrum and the optical field intensity (both as functions of wavelength) at the position of the photoactive region.

One way to describe such a match is to determine the wavelength of the top 3 absorption peaks for a photoactive region, and place the photoactive region such that a peak in the optical field strength for one of these three wavelengths is either in the photoactive region or within 0.05 $\lambda/n$ of the photoactive region, where $\lambda$ is the wavelength of the peak that matches the maximum in the optical field strength, and n is the index of refraction of the layer in which the peak in the optical field intensity is located. Another way to describe such a match is to consider the wavelengths of all of the absorption peaks of the photoactive region(s). The "wavelength" of an absorption peak is the local maximum of the absorption spectra for the peak, and the "top three" peaks are the peaks having the three highest local maximums. When determining the "top" wavelength or wavelengths, the wavelength range may be limited in some embodiments. For example, for some devices intended to absorb the solar spectrum, the range of wavelength considered may be limited to 350-1300 nm because a large fraction of the usable energy of the solar spectra falls within this range, although broader ranges may also be used in some embodiments, including embodiments intended to absorb the solar spectrum.

Locating photoactive regions as described may lead to an increase in the amount of incident light absorbed. In preferred embodiments of the invention, materials and positions of the photoactive regions are selected such that at least about 10%, and more preferably at least about 20%, of the total incident electric field intensity is located in a photoactive region having absorption characteristics such that the energy may be absorbed. As used herein, "optical field intensity" refers to the integral of the square of the electric field over a region. Thus, the total incident electric field intensity is the integral of the square of the electric field over the entire device, and the total electric field of the photoactive regions is the sum of the electric field integrated over each of the photoactive regions. Thus, for a region R, the intensity $I_R$ will be calculated as:

$$I_R = \int_R |\vec{E}|^2$$

as will be appreciated by one skilled in the art. Moreover, the optical field intensity at each point is also a function of wavelength. It is preferred to increase the integral as a function of position over the photoactive regions of the device of: the integral over wavelength of the product of the absorption characteristic of the photoactive region (which may be a function of position and wavelength) with the optical field intensity (which may also be a function of both position and wavelength). This quantity, divided by the total optical field intensity, is the percentage of optical field intensity that may be absorbed by the device, and which is preferably at least 10%, and more preferably at least 20%. The percentage of optical field intensity that may be absorbed may be increased, for example, by selecting materials that are good absorbers of particular wavelengths of light, and placing them where the optical field intensity for that particular wavelength is great. It is believed that this will lead to increased absorption by the photoactive regions, and thus an improved efficiency of the device. In a preferred embodiment, the optical field intensity is based upon a solar spectrum. Note that peak matching may not be the only way to achieve 10% or 20% as described above. Matching photoactive regions that have strong absorption at a particular wavelength (regardless of whether there is a peak) with a strong value for that wavelength in the optical field intensity is one such way to accomplish this goal. By calculating the integral described above, it is possible to determine whether a device will have strong absorption or not.

For the case of a single reflective layer, which is a good approximation of many embodiments, there is a maximum in the optical field strength for a particular wavelength $\lambda$ at an optical path length $\lambda/4$ distant from the reflective layer. Hence, it is further preferred that at least a portion of the first photoactive region 250 is disposed at a perpendicular optical path length about $\lambda_1/4$ ±25% from the edge of the reflective layer closest to the first photoactive region, and at least a portion of the second photoactive region 230 is disposed at a perpendicular optical path length about $\lambda_2/4$ ±25% from the edge of the reflective layer closest to the second photoactive region, where $\lambda_1$ and $\lambda_2$ are the wavelengths at which the first and second photoactive regions are strong absorbers. A "strong absorber" may be quantified in a number of ways. In one embodiment, the wavelength of at least one of the absorption peaks of the second photoactive region may be greater than the wavelength of at least one of the absorption peaks of the first photoactive region. In another embodiment, the wavelength of at least one of the top three absorption peaks of the second photoactive region may be greater than the wavelength of at least one of the top three absorption peaks of the first photoactive region. The 25% margin is a measure of how far the wavelength of the absorption peak may be from the maximum in the optical field strength, while still maintaining a significant overlap between a strong optical field strength and a strong absorption for that wavelength and nearby wavelengths. More generally, for the case of a single reflective layer and configurations that have a similar optical field intensity profile, it is preferred to place longer wavelength absorbing materials proportionally farther from the reflecting surface than shorter wavelength absorbing materials, where the constant of proportionality is $\lambda/n$, where n is the index of refraction of the materials in the stack. Where n varies throughout the stack, a spatially weighted mean index of refraction of the materials comprising the stack may be used. For more complex optical configurations, one of skill in the art, with the benefit of this disclosure, will be able to determine the location of maxima in the optical field strength.

In one embodiment of the invention, a photoactive device is provided having multiple photoactive regions with different absorption characteristics, disposed between a first electrode and a second electrode. Preferably, the absorption characteristics are selected to complement each other, such that one photoactive region absorbs preferentially in a first range of wavelengths, and the second photoactive region absorbs preferentially in a second range of wavelengths different from the first range. A range of wavelengths centered around a wavelength $\lambda_1$ may be considered significantly different from another range $\lambda_2$ if $\lambda_1$ and $\lambda_2$ are at least 10% different. By "preferentially" is meant that a photoactive region is a stronger absorber than another photoactive region to which it is being compared. A photoactive region that "preferentially" absorbs a particular range of wavelengths does not need to be a particularly strong absorber of those wavelengths, or have a maximum in the absorption spectrain those wavelengths, although these criteria would be preferred. "Preferential" absorption in a particular range of wavelengths means merely that a photoactive material is a better absorber than another photoactive material to which it is being compared.

For purposes of comparing how well two different photoactive regions absorb over a particular range of wavelengths, the "average absorption" over the range in question is a useful quantity. The average absorption is the integral over the range of wavelengths of the absorption spectra, divided by the width of the range. For a photoactive region having different concentrations of materials at different places, the average absorption is the integral over both wavelength and position of the absorption spectra, which may be a function of both wavelength and position, divided by the width of the wavelength range and the volume of material. Average absorption allows for a comparison that takes into account localized peaks and valleys within the range, without providing undue weight to the absorption at any specific wavelength. Average absorption over range of $\lambda\pm5\%$ provides a useful benchmark for designing devices.

Two photoactive regions may be considered to have significantly different absorption characteristics over a range centered at a particular wavelength $\lambda$ if the average absorption for a range $\lambda\pm5\%$ for the two regions for is at least 5% different. Smaller differences in average absorption may be the result of inadvertent variations in manufacturing processes, or other factors not specifically directed to controlling absorption spectra.

The amount of energy that a particular photoactive region can absorb in a particular range of wavelengths is determined by both the absorption characteristics of the photoactive region and the optical field intensity for the range of wavelengths. Mathematically, the integral over the space of the photoactive region and over the range of wavelengths of the optical field intensity times the absorption characteristic (both as a function of position and wavelength) provides a measure of this energy. Multiplying the average absorption and average optical field intensity over a range of wavelengths and position is one way to quantify this concept. The "average optical field intensity" of a photoactive region is the integral over space and wavelength of the optical field intensity, divided by the volume of space and the width of the wavelength range.

In order to optimize the amount of energy absorbed by a photoactive region, it is desirable to overlap a high absorption characteristic over a range of wavelengths with a high optical field intensity over the same range of wavelengths. However, there are many other factors that affect device design. Due to manufacturing considerations, it may be desirable to limit the number of materials used to fabricate the device. The properties of materials other than absorption, such as conductivity and charge carrier injection into other materials, also play a role. The position of photoactive regions may be affected by factors other than optical field intensity, such as a desire for blocking layers, injection layers, electrodes, recombination regions, etc. of various thicknesses.

In some embodiments of the invention, the absorption of light by a tandem solar cell is optimized by selecting the absorption characteristics and positions of the photoactive regions, possibly subject to various other constraints. A tandem solar cell has at least two stacked photoactive regions, and may have more than two. A tandem cell may be considered "optimized" if it includes at least two photoactive regions with different absorption characteristics, and the cell absorbs significantly more light than an otherwise equivalent device where the photoactive regions have the same absorption characteristic, i.e., absorption characteristics that are not significantly different. The optimization may be extended to more than 2 cells.

In one embodiment that includes more than 2 cells, some of the cells may have photoactive regions with the same absorption characteristic. The optical field strength for a particular device configuration may have more than one region where the optical field strength for a particular range of wavelengths is high. It may be desirable to position multiple cells having the same absorption characteristic (i.e., absorption characteristics that are not significantly different), that preferentially absorb a particular range of wavelengths, at multiple locations in a device where the optical field strength for that range of wavelengths is high. For example, in devices having a reflective layer, the optical field strength for a particular wavelength may have local maxima at periodic distances from the reflective layer, starting at a distance of $\lambda/4$, and recurring periodically every $\lambda/2$ thereafter, i.e., there may be local maxima at $\lambda/4$, $3\lambda/4$, $5\lambda/4$, etc. So, it may be desirable to position cells that preferentially absorbs a wavelength $\lambda_1$ at distances $\lambda_1/4$ and $\lambda_1/5$ away from the reflective layer, with a cell that preferentially absorbs a different wavelength $\lambda_2$ disposed in between the two cells that preferentially absorb $\lambda_1$, preferably at a location where the optical field strength for wavelength $\lambda_2$ is high.

While many embodiments of the invention are described with respect to two stacked cells, it is understood that a greater number of stacked cells may be used, and the concepts relating to positioning the cells and the blocking layers used adjacent to the cells are generally applicable to stacks having more than two cells.

As used herein, and as would be understood by one skilled in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer.

Figure 3:
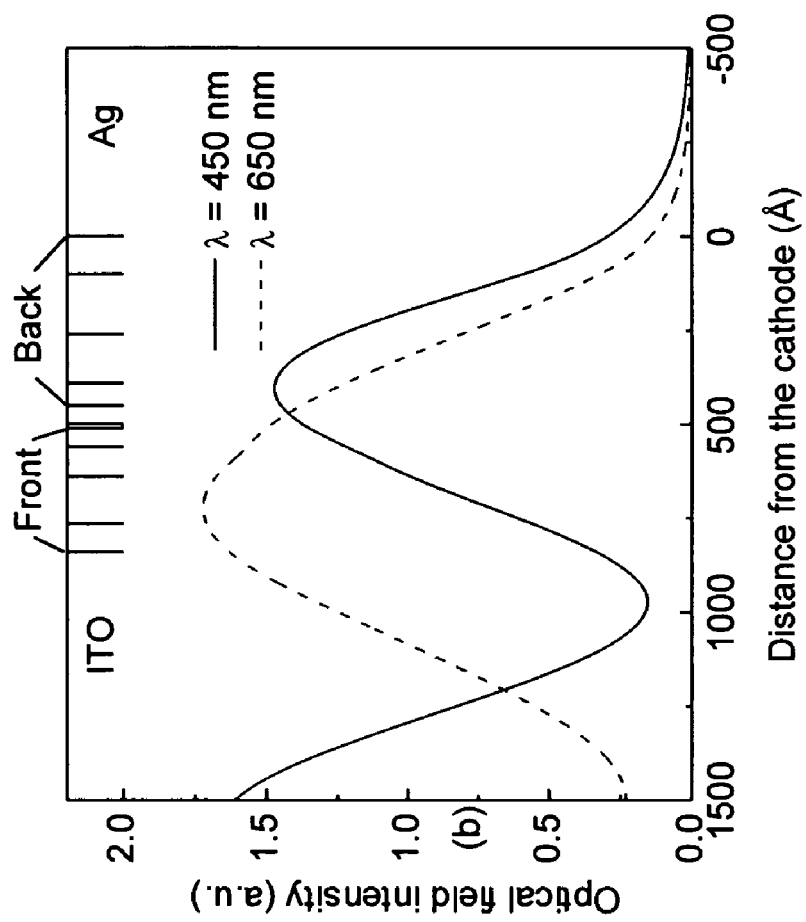
FIG. 3 shows the optical field intensities at λ=450 nm (solid line) and λ=650 nm (dashed line) as a function of the distance from the cathode in the asymmetric organic tandem cell B (see Table I), the structure of which is schematically shown at the top of FIG. 3.
Figure 4:
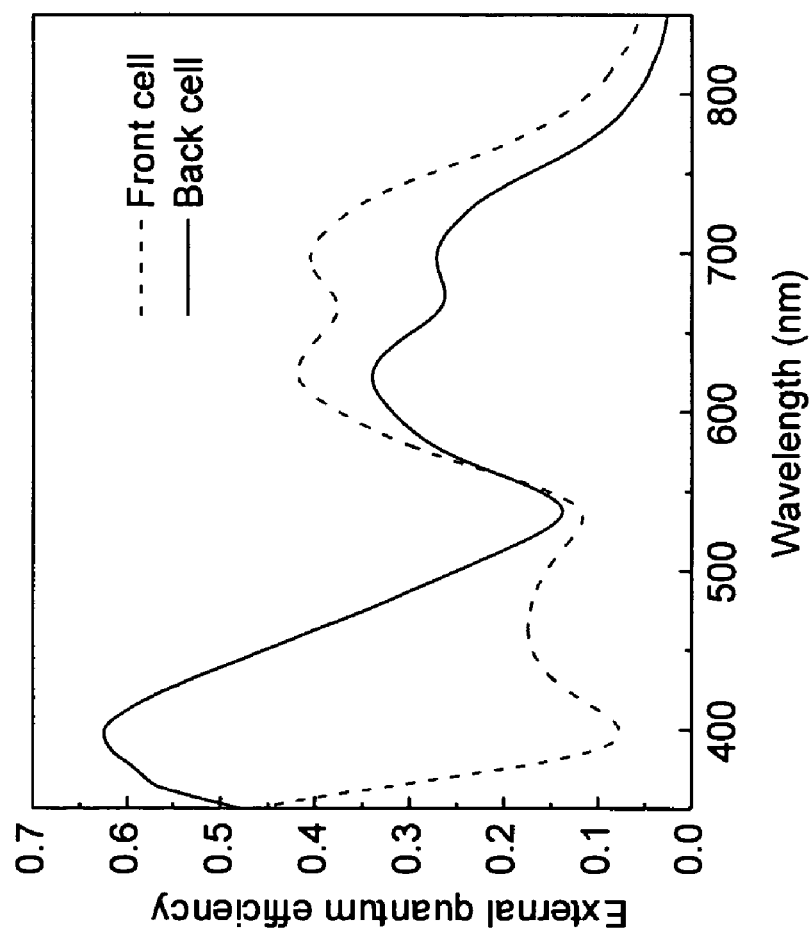
FIG. 4 shows the calculated external quantum efficiency spectra for the front (dashed line) and back (solid line) cell of cell B.

FIG. 3 shows the optical field intensities at $\lambda=450$ nm (solid line) and $\lambda=650$ nm (dashed line) as a function of the distance from the cathode in the asymmetric organic tandem cell B (see Table I), whose structure is shown schematically at the top of FIG. 3. The intensity at $\lambda=450$ nm peaks at approximately 400 Å from the reflecting Ag cathode, or about 300 Å closer than that for $\lambda=650$ nm. Hence, making the front cell rich in shorter wavelength absorbing material(s) and the back cell rich in lower wavelength absorbing material(s) may lead to increased absorption of a broad spectrum. In cell B the back cell has a significantly thicker homogeneous $C_{60}$ layer than the front cell, leading to a higher external quantum efficiency in the $C_{60}$ absorption region ($\lambda<550$ nm), as shown in FIG. 4. As the light intensity at $\lambda\approx650$ nm is primarily located in the front cell, the quantum efficiency at 550 nm$<\lambda<$750 nm may be higher for the front cell, although the thicknesses of the homogeneous CuPc and the mixed layers are approximately the same in both subcells to balance their photocurrents.

FIG. 4 shows the calculated external quantum efficiency spectra for the front (dashed line) and back (solid line) cell of cell B. The asymmetric spectral responses from the two subcells result from the asymmetric tandem cell structure as well as the optical interference.

Figure 5:
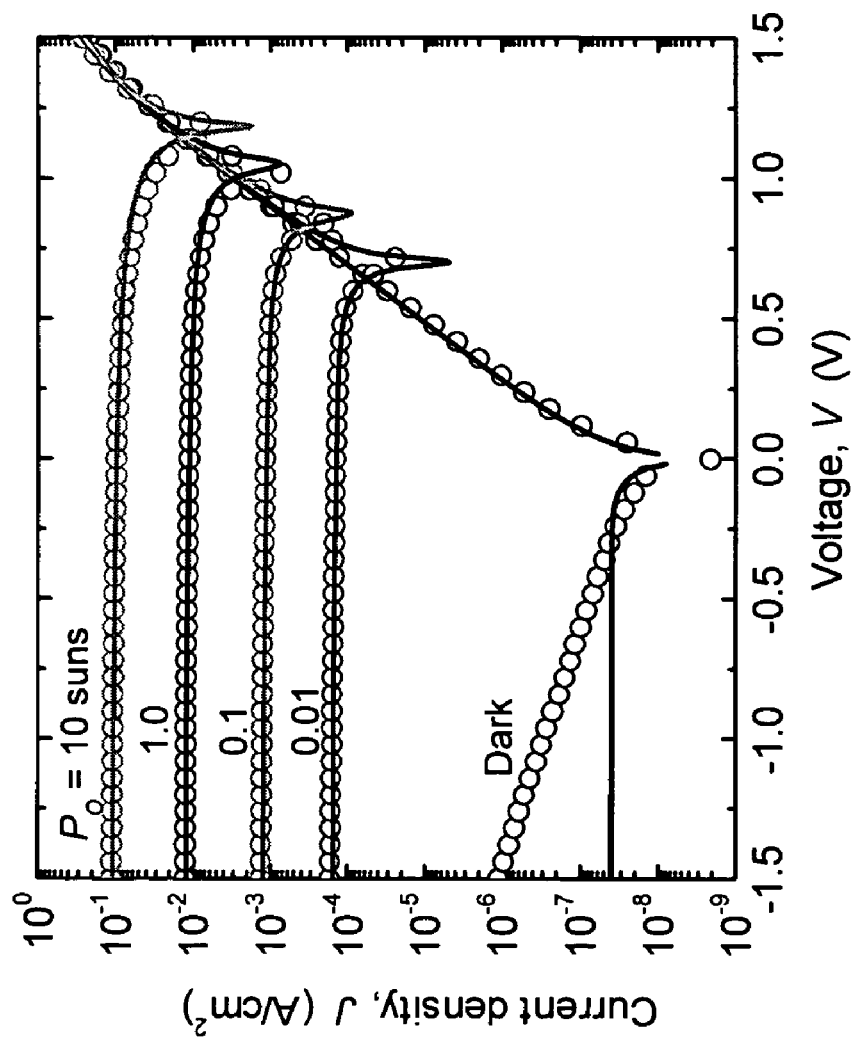
FIG. 5 shows the current density vs. voltage (J-V) characteristics of the asymmetric organic tandem cell A, in the dark and under various intensities of simulated AM1.5G solar illumination.

FIG. 5 shows the current density vs. voltage (J-V) characteristics of the asymmetric organic tandem cell A, in the dark and under various intensities of simulated AM1.5G solar illumination. The experimental J-V characteristics of tandem cell A in the dark and under various intensities of simulated AM1.5G solar illumination are shown (open symbols). A rectification ratio of $10^5$-$10^6$ at ±1.5 V is typical. The open-circuit voltage is $V_{OC}=1.04$ V under 1 sun illumination, and approaches 1.2 V under 10 suns, which may be twice of that of a single CuPc/$C_{60}$ hybrid PM-HJ cell. The solid lines are modeled J-V characteristics, which agrees with the experimental data except for the reverse-bias dark current, in which case generation-recombination current or thermally assisted tunneling may significantly contribute to $J_d$.

Figure 6:
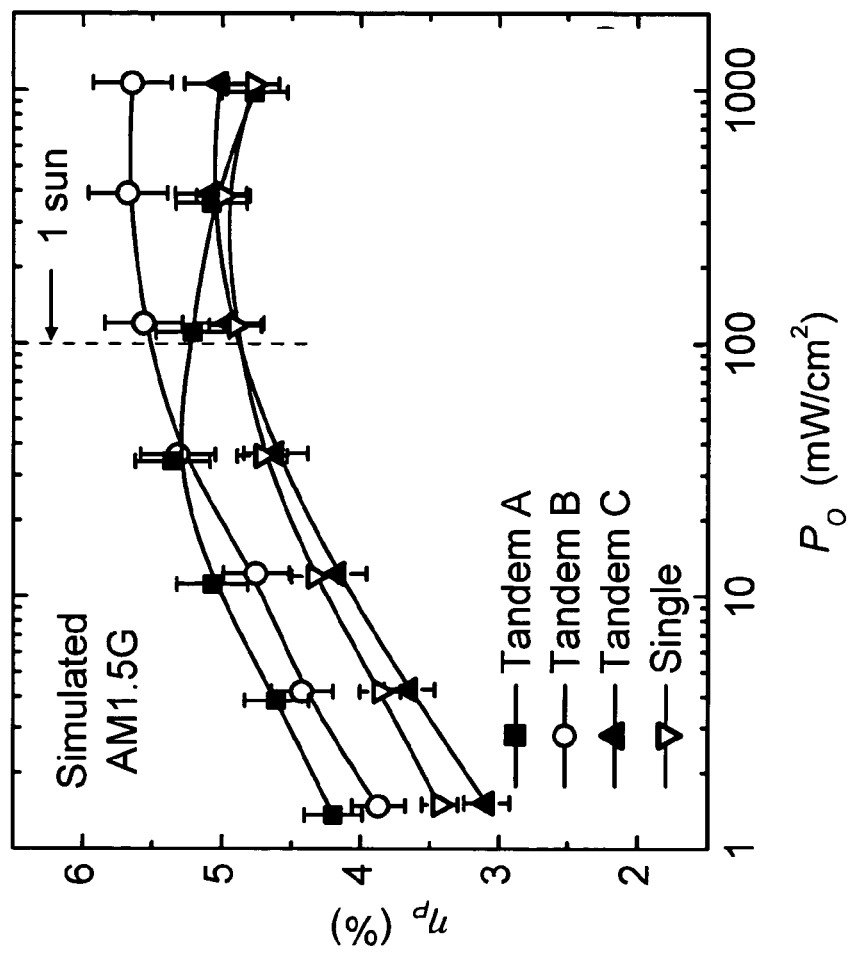
FIG. 6 shows the illumination intensity ($P_O$) dependence of the power conversion efficiencies ($\eta_P$) of asymmetric organic tandem cells (A, filled squares; B, open circles; C, filled triangles) under simulated AM1.5G solar illumination, compared with that of the 5% single CuPc/$C_{60}$ hybrid planar-mixed heterojunction cell (open inverted triangles).

FIG. 6 shows the measured illumination intensity ($P_O$) dependence of the power conversion efficiencies ($\eta_P$) of various asymmetric organic tandem cells (A, filled squares; B, open circles; C, filled triangles) under simulated AM1.5G solar illumination, compared with that of a 5% single CuPc/$C_{60}$ hybrid planar-mixed heterojunction cell (open inverted triangles). The power conversion efficiency of tandem cell A (filled squares), derived from the experimental J-V characteristics in FIG. 5, reaches a maximum of $\eta_P=(5.4\pm0.3)\%$ at $P_O=0.34$ suns. Under higher intensity illumination, the FF decreases (see FIG. 7) due to the relatively thick mixed layers. With thinner mixed layers, tandem cell B (open circles) exhibits a high FF=0.56 even under an intense illumination of approximately 11 suns. This leads to $\eta_P=(5.7\pm0.3)\%$ at $P_O\geq1$ sun, in agreement with the model. However, tandem cell C (filled triangles) has a lower efficiency than model prediction (6.5%), mainly due to a low FF$\approx$0.51. This may suggest a small energy barrier at the $C_{60}$/PTCBI interface impeding electrons transporting to the charge recombination zone. Nevertheless, the efficiencies of tandem cells A and B are higher than the 5% single CuPc/$C_{60}$ hybrid PM-HJ cell (open inverted triangles in FIG. 6), demonstrating the effectiveness of stacking cells.

Figure 7:
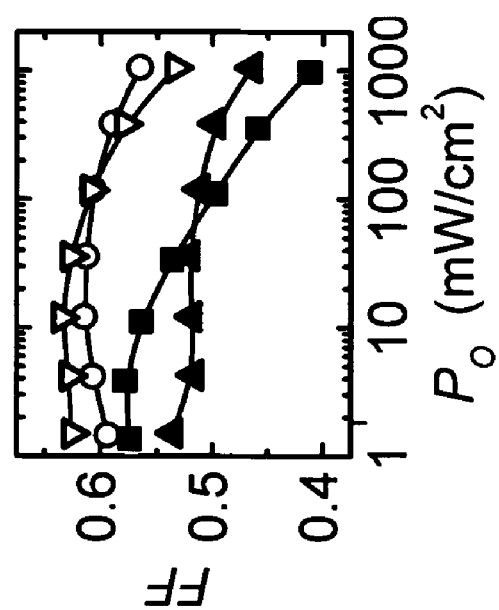
FIG. 7 shows the fill factor (FF) of the tandem and single hybrid PM-HJ cells shown in FIG. 6.

FIG. 7 shows the fill factor (FF) of the tandem and single hybrid PM-HJ cells shown in FIG. 6. Under higher intensity illumination, the FF decreases due to the relatively thick mixed layers. With thinner mixed layers, tandem cell B (open circles) exhibits a high FF=0.56 even under an intense illumination of approximately 11 suns.

Figure 8:
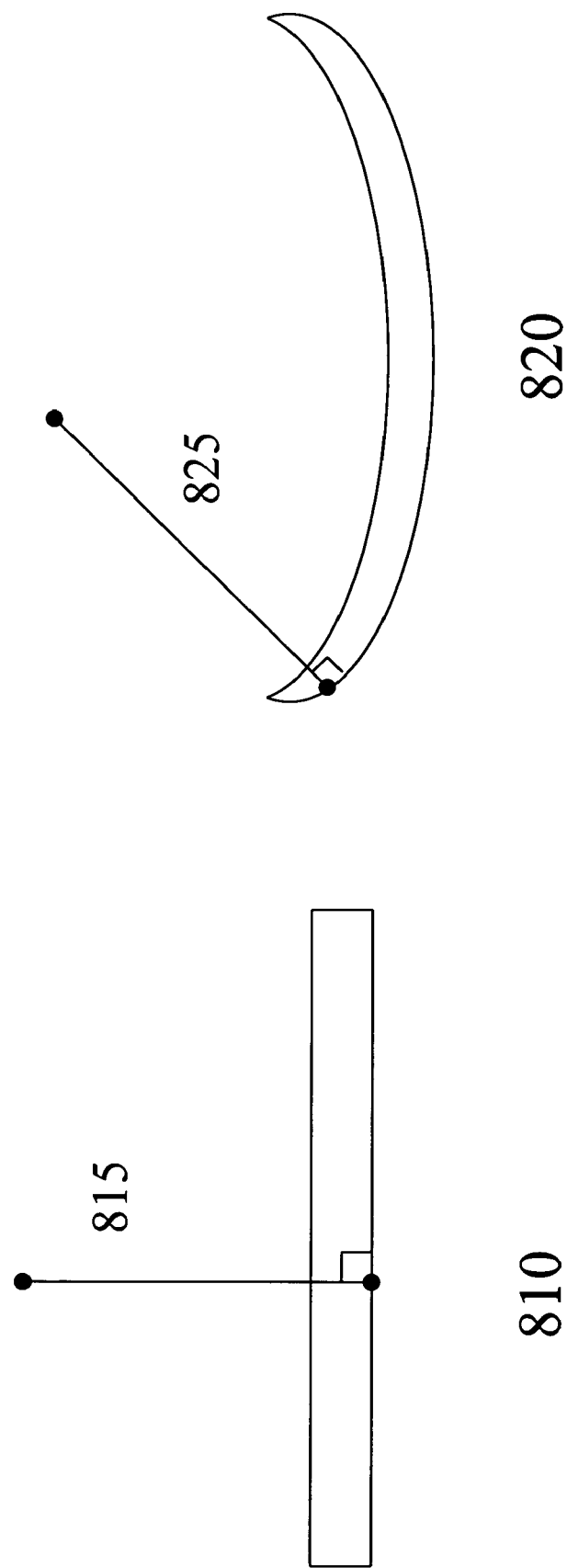
FIG. 8 shows two possible geometries of a PV device with representative perpendicular optical path lengths.

FIG. 8 shows two possible geometries of a PV device 810 and 820, with representative perpendicular optical path lengths 815 and 825. The perpendicular optical path length is measured normal to the surface of the device.

Figure 9:
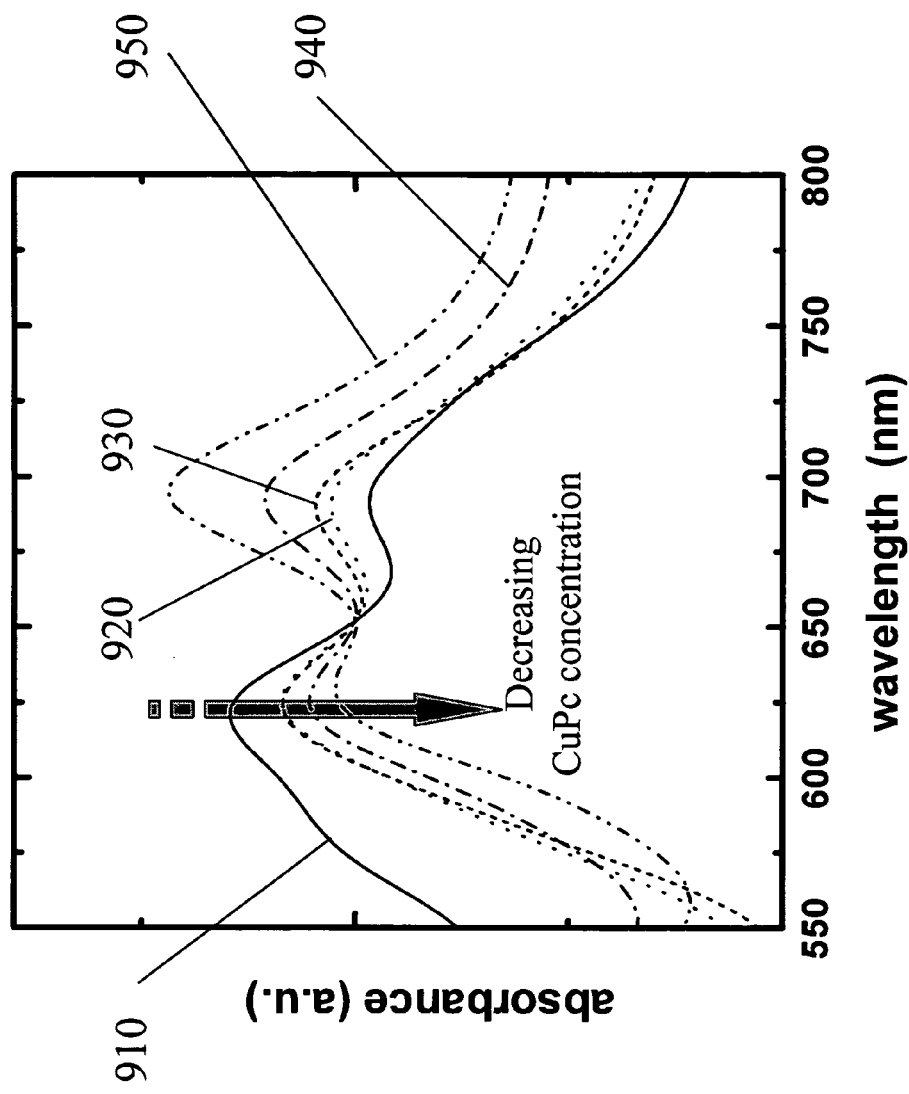
FIG. 9 shows absorption spectra of CuPc:$C_{60}$ films with various mixture ratios, deposited on ITO.

FIG. 9 shows absorption spectra of CuPc:$C_{60}$ films with various mixture ratios, deposited on ITO. The concentrations of CuPc in mixed films are 100% CuPc(CuPc single layer) 910, 62% 920, 40% 930, 33% 940 and 21% 950. The pure CuPc film has two peaks centered at wavelengths of 620 nm and 695 nm. The longer wavelength peak is due to molecular Frenkel exciton generation, whereas the shorter wavelength feature is attributed to the formation of CuPc aggregates. The longer wavelength peak is dominant in the gas phase or dilute solution. FIG. 9 shows that the magnitude of the longer wavelength peak increases with increasing $C_{60}$ content. Accordingly, CuPc molecules show a lower tendency to aggregate with increasing $C_{60}$ content. This suggests that an increase in $C_{60}$ concentration inhibits CuPc aggregation, thereby reducing hole transport in the mixed film, perhaps leading to a low carrier collection efficiency. This is reflected in the reduced power efficiency ($\eta_P=(2.6\pm0.1)\%$, see Table 2) of a CuPc:C60 (1:2) mixed layer PV cell. However, at a concentration of 1:1, there is sufficient aggregation of CuPc molecules to allow for low resistance hole transport, while the much higher symmetry $C_{60}$ molecules may also form a percolation path for efficient electron transport to the cathode.

Table 1 shows the layer thicknesses (in Å) of three organic tandem photovoltaic cells as well as predicted performance parameters (short-circuit current density $J_{SC}$, open-circuit voltage $V_{OC}$, fill factor FF, and power conversion efficiency $\eta_P$) under 1 sun AM1.5G solar illumination. The charge recombination zone in each tandem cell consists of a 5 Å thick Ag nanoclusters layer and a 50 Å thick m-MTDATA doped with 5 mol % $F_4$-TCNQ.

Table 2 shows the parameters used in modeling the J-V characteristics of CuPc/$C_{60}$ hybrid PM-HJ tandem PV cells.

It is understood that the embodiments described herein are exemplary only, and that other embodiments may be used in accordance with the present invention. For example, the order of the layers illustrated may be altered. For example, in FIGS. 1 and 2, the positions of the photoactive layers, i.e., organic regions 230 and 250 may be switched, with appropriate repositioning of blocking layers, etc. Additional layers may or may not also be present, such as blocking layers, charge recombination layers, etc. For example, blocking layers may be removed, and/or additional blocking layers may be present. Non-photoactive regions may be present, and may be used to adjust the position of the photoactive regions relative to a reflecting layer. Various solar cell configurations may be used, such as tandem solar cells. Different materials than those specifically described may be used. For example, a device where all of the electrodes are ITO may be fabricated such that the device may be transparent to some degree. Additionally, the device could be fabricated onto a substrate, and then applied to a supporting surface, such that the last electrode deposited is closest to the supporting surface. Although many embodiments are described with respect to solar cells, other embodiments may be used in other types of photosensitive devices having a D-A heterojunction, such as a photodetector.

The power efficiencies achieved by embodiments of the invention are higher than previous efficiencies achieved for organic solar cells. These results may be due to interactions between several features of embodiment of the invention, including the use of an unmixed organic photoactive layer in connection with a mixed organic photoactive layer, with thicknesses and positions selected with efficiency in mind. Embodiments of the invention may be capable of reaching power conversion efficiencies approaching that of a-Si cells, currently in production, with efficiencies of 7%-10%. It is expected that with refinement of devices consistent with embodiments of the invention, even higher power efficiencies may be achieved. For example, by applying simple anti-reflection coatings to the glass substrates, an additional 10% improvement to efficiencies may be possible, suggesting that the tandem cell structure proposed here may attain efficiencies in excess of 7%. Stacking more than two cells in series could help to harvest more light, although an efficient cell structure is more difficult to achieve. An ultimate advantage of the asymmetric tandem cell structure is that it enables the incorporation of different donor-acceptor material combinations in the individual subcells to cover a broader solar spectrum region than the current $CuPc$-$C_{60}$ system. Provided that high production yields and long operational lifetimes are possible in properly packaged organic solar cell modules, the asymmetric hybrid PM-HJ tandem cell has considerable potential for use a variety of applications.

EXAMPLES

In one embodiment of the invention, an efficient photovoltaic cell is provided. A cell with two stacked hybrid planar-mixed heterojunction cells was fabricated on a glass substrate pre-coated with transparent conducting ITO. The device has the structure: ITO/75 Å CuPc/122 Å CuPc:$C_{60}$ (1.2:1 by weight)/80 Å $C_{60}$/50 Å PTCBI/5 Å Ag/50 Å m-MTDATA:F4-TCNQ/60 Å CuPc/132 Å CuPc:$C_{60}$ (1.2:1 by weight)/160 Å $C_{60}$/75 Å BCP/Ag. The cell farther away from the cathode is slightly rich in CuPc, which absorbs in the spectral region from 550 nm to 750 nm, whereas the cell closer to the cathode is rich in $C_{60}$, which absorbs in the spectral region from 350 nm to 550 nm. A maximum power efficiency was measured of (5.6±0.3)% under 1 to 4 suns simulated AM1.5G solar illumination.

The organic hybrid planar-mixed heterojunction photovoltaic cells were fabricated on glass substrates precoated with a ~1500 Å thick transparent, conducting ITO anode with a sheet resistance of 15 Ω/sq. The substrates were cleaned in solvent followed by UV-ozone treatment for 5 minutes. The organic layers and a metal cathode were deposited via thermal evaporation in a high vacuum chamber with a base pressure $~2\times10^{-7}$ Torr. A CuPc layer with a thickness of $d_D$~50–200 Å, a co-deposited layer of CuPc: $C_{60}$ (1:1 by weight) with a thickness of $d_m$~0–300 Å, and a $C_{60}$ layer with a thickness of $d_A$~250–400 Å, are sequentially deposited onto the ITO anode, followed by a 100 Å thick exciton-blocking layer of BCP. Finally, a 1000 Å thick Ag cathode was evaporated through a shadow mask with 1 mm diameter openings.

Current-voltage characteristics of the PV cells at 25° C. in the dark and under simulated AM1.5G solar illumination from a 150 W Xe-arc lamp (Oriel Instruments) were measured using an HP 4155B semiconductor parameter analyzer. The illumination intensity was varied using neutral density filters and measured with a calibrated broadband optical power meter (Oriel Instruments).

Although the present invention is described with respect to particular examples and preferred embodiments, it is understood that the present invention is not limited to these examples and embodiments. The present invention as claimed may therefore include variations from the particular examples and preferred embodiments described herein, as will be apparent to one of skill in the art.

What is claimed is:

1. A device comprising:
   a first electrode;
   a second electrode;
   a first organic photoactive region disposed between the first electrode and the second electrode;
   a second organic photoactive region disposed between the first electrode and the second electrode, wherein the first organic photoactive region and the second organic photoactive region are arranged in a stack between the first electrode and the second electrode; and
   a metal or metal substitute disposed in the stack between the first organic photoactive region and the second organic photoactive region;
   wherein the first organic photoactive region and the second organic photoactive region have different average absorption characteristics, and wherein the first organic photoactive region and the second organic photoactive region each has an average optical field intensity;
   wherein the average absorption of the first photoactive region is greater than the average absorption of the second photoactive region over a range of wavelengths $\lambda_1 \pm 5\%$;
   wherein the average absorption of the second photoactive region is greater than the average absorption of the first photoactive region over a range of wavelengths $\lambda_2 \pm 5\%$;
   wherein $\lambda_2$ is at least 10% greater than $\lambda_1$;
   wherein at least the first organic photoactive region or the second organic photoactive region comprises a hybrid planar-mixed heterojunction.

2. The device of claim 1, wherein the device includes a reflective layer having a side, and wherein the first organic photoactive region and the second organic photoactive region are disposed on the same side of the reflective layer, and wherein first photoactive region is disposed closer to the reflective layer than the second photoactive region.

3. The device of claim 2, wherein the first electrode is the reflective layer.

4. The device of claim 2, wherein the first electrode and the second electrode are not reflective.

5. The device of claim 1, wherein the average absorption of the first photoactive region is at least 5% greater than the average absorption of the second photoactive region over a range of wavelengths $\lambda_1 \pm 5\%$; and wherein the average absorption of the second photoactive region is at least 5% greater than the average absorption of the first photoactive region over a range of wavelengths $\lambda_2 \pm 5\%$.

6. The device of claim 1, wherein the first photoactive region and the second photoactive region both comprise the materials $C_{60}$ and CuPc, and the percentage of $C_{60}$ in the first photoactive region is greater than the percentage of $C_{60}$ in the second photoactive region.

7. The device of claim 1, wherein the average optical field intensity for the range of wavelengths $\lambda_1 \pm 5\%$ at the position of the first photoactive region is greater than the average optical field intensity for the range of wavelengths $\lambda_1 \pm 5\%$ at the position of the second photoactive region, and wherein the average optical field intensity for the range of wavelengths $\lambda_2 \pm 5\%$ at the position of the second photoactive region is greater than the average optical field intensity for the range of wavelengths $\lambda_2 \pm 5\%$ at the position of the first photoactive region.

8. The device of claim 5, wherein the average optical field intensity for the range of wavelengths $\lambda_1 \pm 5\%$ at the position of the first photoactive region is greater than the average optical field intensity for the range of wavelengths $\lambda_2 \pm 5\%$ at the position of the second photoactive region, and wherein the average optical field intensity for the range of wavelengths $\lambda_2 \pm 5\%$ at the position of the second photoactive region is greater than the average optical field intensity for the range of wavelengths $\lambda_2 \pm 5\%$ at the position of the first photoactive region.

9. The device of claim 1, further comprising a third organic photoactive region disposed between the first electrode and the second electrode, wherein the third organic photoactive region has an average absorption.

10. The device of claim 9,
wherein the first organic photoactive region, the second organic photoactive region, and the third photoactive region each have different absorption characteristics;
wherein the average absorption of the third photoactive region is greater than the average absorption of the first photoactive region and the average absorption of the second photoactive region over a range of wavelengths $\lambda_3 \pm 5\%$;
wherein the average absorption of the first photoactive region is greater than the average absorption of the third photoactive region over a range of wavelengths $\lambda_1 \pm 5\%$; and
wherein the average absorption of the second photoactive region is greater than the average absorption of the third photoactive region over a range of wavelengths $\lambda_2 \pm 5\%$.

11. The device of claim 9, wherein the third photoactive region has an absorption characteristic that is the same as the absorption characteristic of the first photoactive region.

12. The device of claim 1, wherein the metal or metal substitute disposed in the stack between the first organic photoactive region and the second organic photoactive region forms an electrode, a charge recombination layer, or a charge transfer layer.

* * * * *

UNITED STATES PATENT AND TRADEMARK OFFICE
CERTIFICATE OF CORRECTION

| | | |
|---|---|---|
| PATENT NO. | : 7,375,370 B2 | Page 1 of 1 |
| APPLICATION NO. | : 10/979145 | |
| DATED | : May 20, 2008 | |
| INVENTOR(S) | : Forrest et al. | |

It is certified that error appears in the above-identified patent and that said Letters Patent is hereby corrected as shown below:

Column 1, line 16, please insert the following paragraph:

GOVERNMENT RIGHTS

This invention was made with U.S. Government support under Contract No. ACQ-1-30619-05 awarded by NREL-DOE. The government has certain rights in this invention.

Signed and Sealed this

Eleventh Day of November, 2008

JON W. DUDAS
*Director of the United States Patent and Trademark Office*